(12) United States Patent
Park et al.

(10) Patent No.: US 11,271,015 B2
(45) Date of Patent: Mar. 8, 2022

(54) DISPLAY DEVICE

(71) Applicant: Samsung Display Co., LTD., Yongin-si (KR)

(72) Inventors: Joon Seok Park, Yongin-si (KR); Myoung Hwa Kim, Seoul (KR); Tae Sang Kim, Seoul (KR); Hyung Jun Kim, Seoul (KR); Yeon Keon Moon, Hwaseong-si (KR); Geun Chul Park, Suwon-si (KR); Sang Woo Sohn, Yongin-si (KR); Jun Hyung Lim, Seoul (KR); Kyung Jin Jeon, Incheon (KR); Hye Lim Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/876,984

(22) Filed: May 18, 2020

(65) Prior Publication Data

US 2021/0036029 A1 Feb. 4, 2021

(30) Foreign Application Priority Data

Jul. 31, 2019 (KR) .................. 10-2019-0093017

(51) Int. Cl.
*H01L 27/12* (2006.01)
*G02F 1/1362* (2006.01)
*H01L 27/32* (2006.01)

(52) U.S. Cl.
CPC .... *H01L 27/1225* (2013.01); *G02F 1/136286* (2013.01); *H01L 27/127* (2013.01); *H01L 27/1237* (2013.01); *H01L 27/3276* (2013.01)

(58) Field of Classification Search
CPC .............. H01L 27/127; H01L 27/3276; H01L 27/1237; H01L 27/124; H01L 27/1225;
(Continued)

(56) References Cited

U.S. PATENT DOCUMENTS 7,309,625 B2 * 12/2007 Yen ...................... H01L 27/1214
438/149
9,356,081 B2 * 5/2016 Choi ..................... G09G 3/3258
(Continued)

FOREIGN PATENT DOCUMENTS

JP 2019-024105 2/2019
KR 10-2016-0130018 11/2016

OTHER PUBLICATIONS

Rongsheng Chen et al., "Self-aligned top-gate InGaZnO thin film transistors using SiO2/Al2O3 stack gate dielectric", Thin Solid Films, pp. 572-575, vol. 548, Elsevier B. V.

*Primary Examiner* — Nikolay K Yushin
(74) *Attorney, Agent, or Firm* — Kile Park Reed & Houtteman PLLC

(57) ABSTRACT

A display device includes a substrate, a buffer layer disposed on the substrate, a first semiconductor layer disposed on the buffer layer and including an oxide semiconductor and a first active layer, a first gate insulating layer disposed on the first semiconductor layer and the buffer layer, a second semiconductor layer disposed on the first gate insulating layer and including an oxide semiconductor, a second active layer, and a first oxide layer on the first active layer, a second gate insulating layer disposed on the second semiconductor layer, a first conductive layer disposed on the second gate insulating layer, an insulating layer disposed on the first conductive layer, a second conductive layer disposed on the insulating layer, a passivation layer disposed on the second conductive layer, and a third conductive layer disposed on the first passivation layer.

21 Claims, 35 Drawing Sheets

(58) Field of Classification Search
CPC ............. H01L 27/3262; H01L 27/1251; H01L 27/3272; H01L 29/78633; H01L 29/7869; H01L 29/78696; H01L 29/66969; H01L 29/78648; H01L 29/124; H01L 2227/323; H01L 2227/326; G02F 1/136286; G02F 1/1368; G02F 1/133622; G02F 1/1343; G02F 1/13439
See application file for complete search history.

(56) References Cited

U.S. PATENT DOCUMENTS

| | | | |
|---|---|---|---|
| 10,249,696 B2 * | 4/2019 | Kim | H01L 27/3272 |
| 10,361,290 B2 * | 7/2019 | Yamazaki | H01L 21/02554 |
| 10,367,012 B2 * | 7/2019 | Lim | H01L 29/7869 |
| 2006/0205126 A1 * | 9/2006 | Yen | H01L 27/1214 |
| | | | 438/163 |
| 2006/0246360 A1 * | 11/2006 | Hwang | H01L 29/78633 |
| | | | 430/5 |
| 2015/0137099 A1 * | 5/2015 | Choi | H01L 27/1225 |
| | | | 257/40 |
| 2015/0263141 A1 * | 9/2015 | Yamazaki | H01L 21/02326 |
| | | | 438/104 |
| 2018/0076238 A1 * | 3/2018 | Lim | H01L 27/1251 |
| 2018/0145123 A1 * | 5/2018 | Kim | H01L 29/78633 |
| 2020/0259020 A1 * | 8/2020 | Watakabe | H01L 29/4908 |

* cited by examiner

FIG. 12
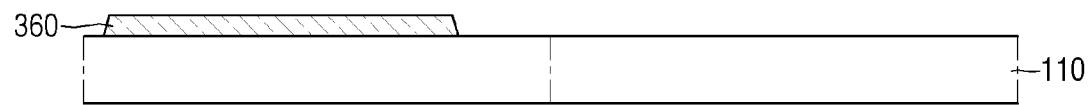
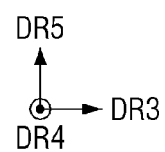

FIG. 13
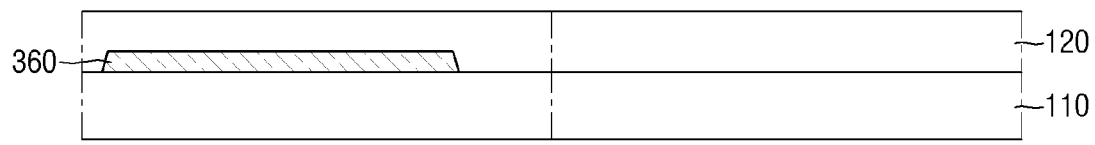
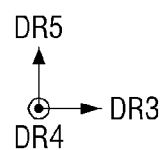

FIG. 14
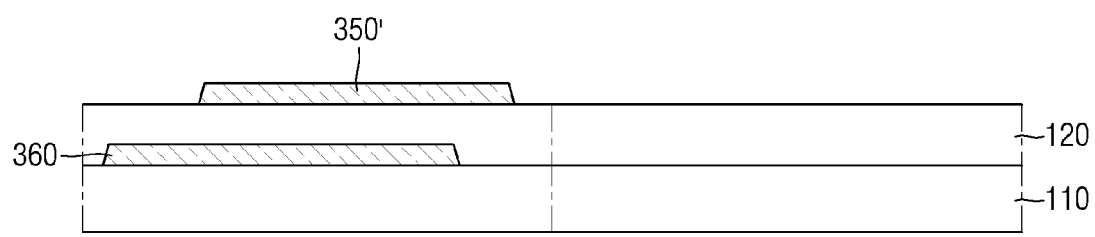
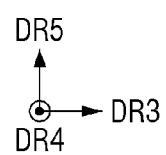

FIG. 15
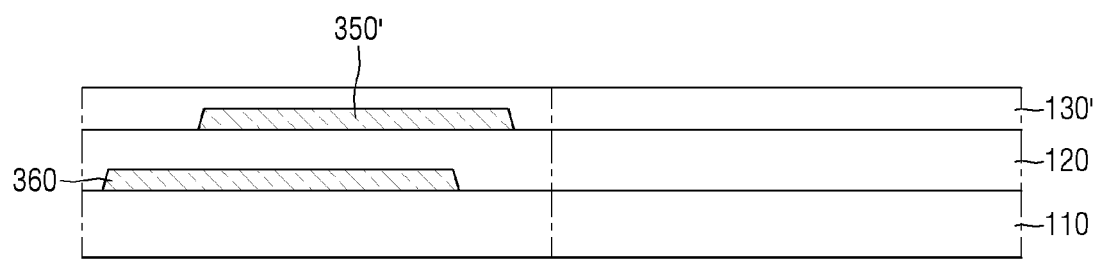
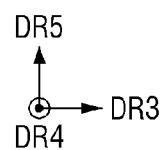

FIG. 16
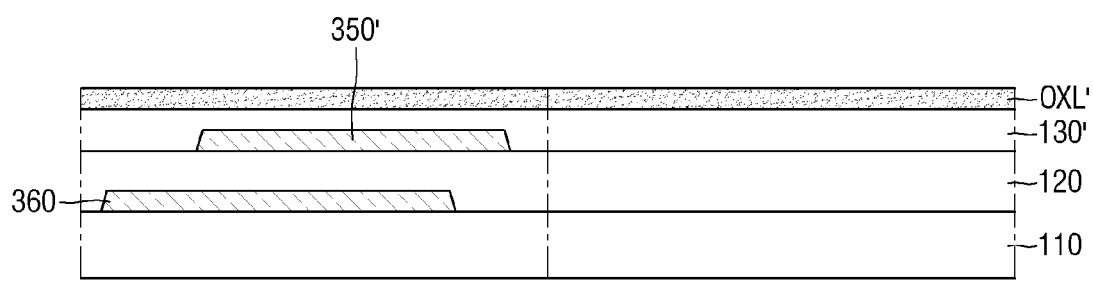
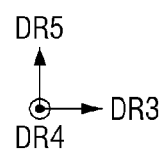

FIG. 17
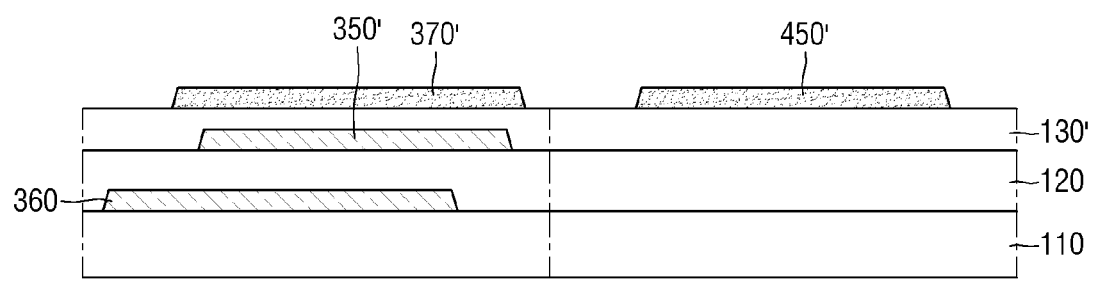
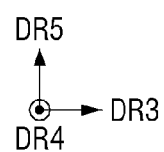

FIG. 18
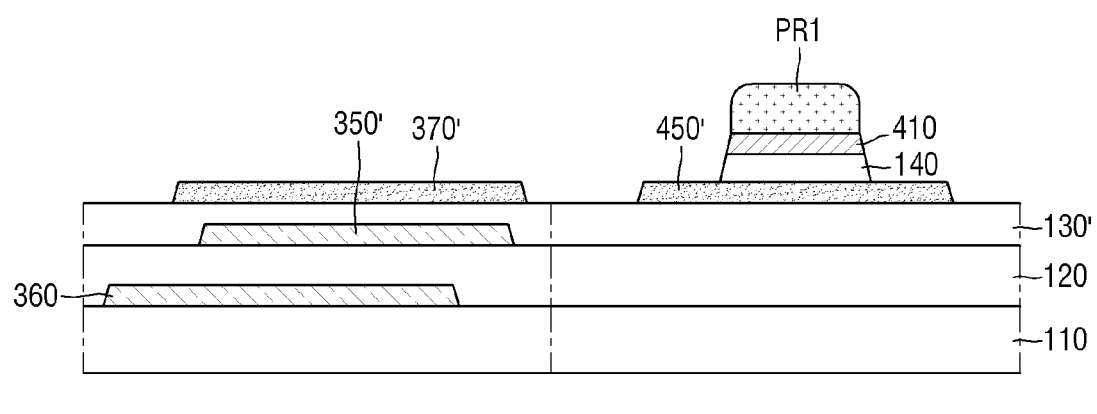
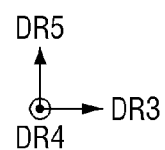

FIG. 32
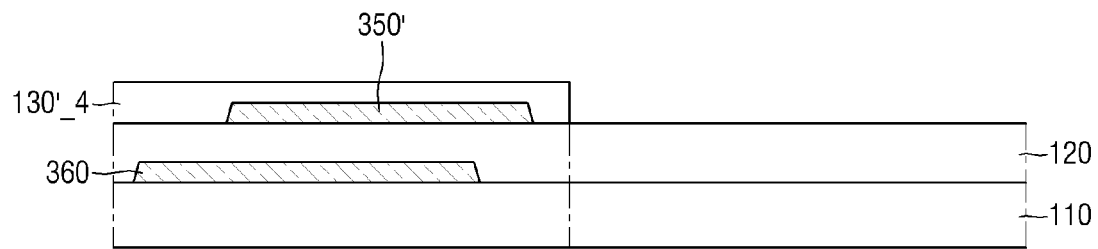
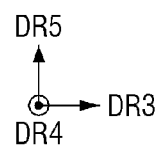
FIG. 33
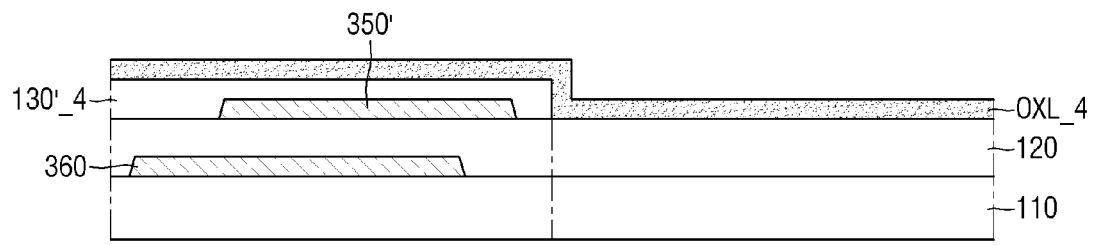
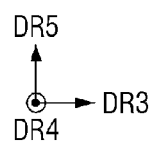

DISPLAY DEVICE

CROSS-REFERENCE TO RELATED APPLICATIONS

This application claims priority to and benefits of Korean Patent Application No. 10-2019-0093017 under 35 U.S.C. § 119 filed in the Korean Intellectual Property Office on Jul. 31, 2019, the entire contents of which are incorporated herein by reference.

BACKGROUND

1. Technical Field

The disclosure relates to a display device, and, to a display device including a thin-film transistor including an oxide layer.

2. Description of the Related Art

The importance of display devices increases as multimedia technology evolves. Accordingly, a variety of types of display devices such as organic light-emitting display (OLED) devices and liquid-crystal display (LCD) devices are currently in development.

Display devices display images and may include a display panel such as an organic light-emitting display panel or a liquid-crystal display panel. A light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

Such a display device may include a display panel, a gate driver, a data driver and a timing controller. The display panel may include data lines, gate lines, and pixels. Pixels may be formed at the intersections of the data lines and the gate lines. Each of the pixels may receive a data voltage from a data line when a gate signal is supplied to a gate line using a thin-film transistor as a switching element. Each of the pixels may emit light with a predetermined brightness according to the data voltages.

A display device capable of displaying an image at a high resolution, for example, up to ultra high definition (UHD) has been released. A display device capable of displaying an image at a high resolution, for example, up to 8K ultra high definition (UHD) is recently being developed. UHD refers to 3,840×2,160 resolution, and 8K UHD refers to 7,680×4,320 resolution.

In a high-resolution display device, the number of pixels increases. Accordingly, the driving current of each of the pixels may be reduced. As a result, the driving voltage range of the driving transistor of each of the pixels may be reduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device including a driving transistor including an active layer and an oxide layer having an oxide semiconductor, and a switching transistor not including the oxide layer and having an active layer located or disposed on a layer different from the active layer of the driving transistor.

It should be noted that objects of the disclosure are not limited to the above-mentioned object. Other objects of the disclosure will be apparent to those skilled in the art from the following descriptions.

According to an embodiment, each of pixels of a display device may include a driving transistor including an active layer and an oxide layer capable of supplying oxygen to the active layer, and a switching transistor including one oxide semiconductor layer and no oxide layer. The active layer of the driving transistor and the active layer of the switching transistor may be located or disposed on different layers, and the gate insulating layers located or disposed thereon may also be located or disposed on different layers.

The driving transistor may further include the oxide semiconductor of an oxygen supply layer to ensure a wide range of driving voltages for driving each pixel. The switching transistor may have high electron mobility in the channel region.

It should be noted that effects of the disclosure are not limited to those described above and other effects of the disclosure will be apparent to those skilled in the art from the following descriptions.

According to an embodiment of the disclosure, a display device may include a substrate, a buffer layer disposed on the substrate, a first semiconductor layer, which includes an oxide semiconductor, disposed on the buffer layer, the first semiconductor layer including a first active layer, a first gate insulating layer disposed on the first semiconductor layer and the buffer layer, a second semiconductor layer, which includes an oxide semiconductor, disposed on the first gate insulating layer, the second semiconductor layer including a second active layer, and a first oxide layer disposed on the first active layer, a second gate insulating layer disposed on the second semiconductor layer, a first conductive layer disposed on the second gate insulating layer and including a gate electrode, an interlayer insulating layer disposed on the first conductive layer and not overlapping with the first semiconductor layer, a second conductive layer disposed on the interlayer insulating layer and the second semiconductor layer and including a gate electrode, a source electrode, and a drain electrode, a passivation layer disposed on the second conductive layer; and a third conductive layer disposed on the passivation layer and including a source electrode, a drain electrode, and a conductive pattern, wherein the second active layer may not overlap the first active layer.

In an embodiment, the oxide semiconductor of each of the first semiconductor layer and the second semiconductor layer may include at least one of indium (In), gallium (Ga), zinc (Zn), tin (Sn) and hafnium (Hf).

In an embodiment, the first gate insulating layer may be disposed between the second active layer and the buffer layer, and the second active layer may be disposed on the first gate insulating layer.

In an embodiment, the second conductive layer may include a first gate electrode disposed on the first oxide layer and overlapping the first active layer in a thickness direction, and the first conductive layer may include a second gate electrode disposed on the second gate insulating layer and overlapping the second active layer in the thickness direction.

In an embodiment, the second conductive layer may include a first source electrode and a first drain electrode, wherein the first source electrode may be in contact with a side of the first active layer through a first contact hole penetrating the interlayer insulating layer, and the first drain electrode may be in contact with another side of the first active layer through a second contact hole penetrating the interlayer insulating layer.

In an embodiment, the display device may further include a light-blocking layer disposed between the substrate and the buffer layer, wherein the light-blocking layer may include a first light-blocking layer disposed below the first active layer and a second light-blocking layer disposed below the second active layer.

In an embodiment, the first source electrode may be in contact with the first light-blocking layer through a third contact hole penetrating the passivation layer and the buffer layer.

In an embodiment, the first conductive layer may include a second source electrode and a second drain electrode, wherein the second source electrode may be in contact with a side of the second active layer through a fourth contact hole penetrating the interlayer insulating layer, and the second drain electrode may be in contact with another side of the second active layer through a fifth contact hole penetrating the interlayer insulating layer.

In an embodiment, the conductive pattern may include a first conductive pattern in contact with the second source electrode through a sixth contact hole penetrating through the passivation layer, and a second conductive pattern in contact with the second drain electrode through a seventh contact hole penetrating through the passivation layer.

In an embodiment, the display device may include a protective layer on the third conductive layer.

In an embodiment, the oxide semiconductor of each of the first semiconductor layer and the second semiconductor layer may include at least one of indium-tin oxide (ITO), indium-gallium-tin oxide (ITGO), indium-gallium-zinc oxide (IGZO) and indium-gallium-zinc-tin oxide (IGZTO).

According to another embodiment of the disclosure, a display device includes pixels connected to scan lines and data lines, the data lines intersecting the scan lines, wherein each of the pixels includes a light-emitting element, a driving transistor to control a driving current applied to the light-emitting element according to a data voltage applied from the data lines, and a switching transistor to apply the data voltage of the data line to the driving transistor according to a scan signal applied to the scan lines, wherein the driving transistor includes a first active layer including an oxide semiconductor and a first oxide layer disposed on the first active layer and including an oxide semiconductor, and the switching transistor includes a second active layer including a same oxide semiconductor as the first oxide layer, and wherein a first gate insulating layer disposed on the first active layer and a second gate insulating layer disposed on the second active layer are disposed on different layers.

In an embodiment, the oxide semiconductor of the first active layer may include at least one of indium (In), gallium (Ga), zinc (Zn), tin (Sn) and hafnium (Hf).

In an embodiment, the oxide semiconductor of each of the first oxide layer and the second active layer may include at least one of indium (In), gallium (Ga), zinc (Zn), tin (Sn) and hafnium (Hf).

In an embodiment, the second gate insulating layer may be disposed above the first gate insulating layer.

In an embodiment, the first gate insulating layer may be disposed below the second active layer, and the second active layer may be disposed on the first gate insulating layer.

In an embodiment, the driving transistor may include a first gate electrode disposed on the first oxide layer and overlapping the first active layer in a thickness direction, and the switching transistor may include a second gate electrode disposed on the second gate insulating layer and overlapping the second active layer in the thickness direction.

In an embodiment, the driving transistor may include a first source electrode in contact with a side of the first active layer through a first contact hole penetrating through a passivation layer disposed on the first active layer; and a first drain electrode in contact with another side of the first active layer through a second contact hole penetrating through the passivation layer.

In an embodiment, the switching transistor may include a second source electrode in contact with a side of the second active layer through a third contact hole penetrating through an interlayer insulating layer disposed on the second active layer; and a second drain electrode in contact with another side of the second active layer through a fourth contact hole penetrating through the interlayer insulating layer.

In an embodiment, the passivation layer may be disposed on the second source electrode and the second drain electrode, the second source electrode may be in contact with a first conductive pattern disposed on the passivation layer through a fifth contact hole penetrating through the passivation layer, and the second drain electrode may be in contact with a second conductive pattern disposed on the passivation layer through a sixth contact hole penetrating through the passivation layer.

In an embodiment, a method of manufacturing a display device includes forming a first semiconductor layer including: forming a first active layer on a substrate, wherein the first semiconductor layer includes an oxide semiconductor; forming a first gate insulating layer on the first semiconductor layer; forming a second semiconductor layer including: forming a second active layer; and forming a first oxide layer on the first active layer, wherein the second semiconductor layer includes an oxide semiconductor; forming a second gate insulating layer on the second semiconductor layer; forming a first conductive layer on the second gate insulating layer; forming an insulating layer on the first conductive layer; and forming a second conductive layer on the insulating layer.

BRIEF DESCRIPTION OF THE DRAWINGS

The above and other aspects and features of the disclosure will become more apparent by describing in detail embodiments thereof with reference to the attached drawings, in which:

FIGS. 12 to 26 are schematic cross-sectional views showing process steps of fabricating a display device according to an embodiment.

FIGS. 32 and 33 are schematic cross-sectional views showing process steps of a method of fabricating the display device shown in FIG. 31.

DETAILED DESCRIPTION OF THE EMBODIMENTS

Figure 1:
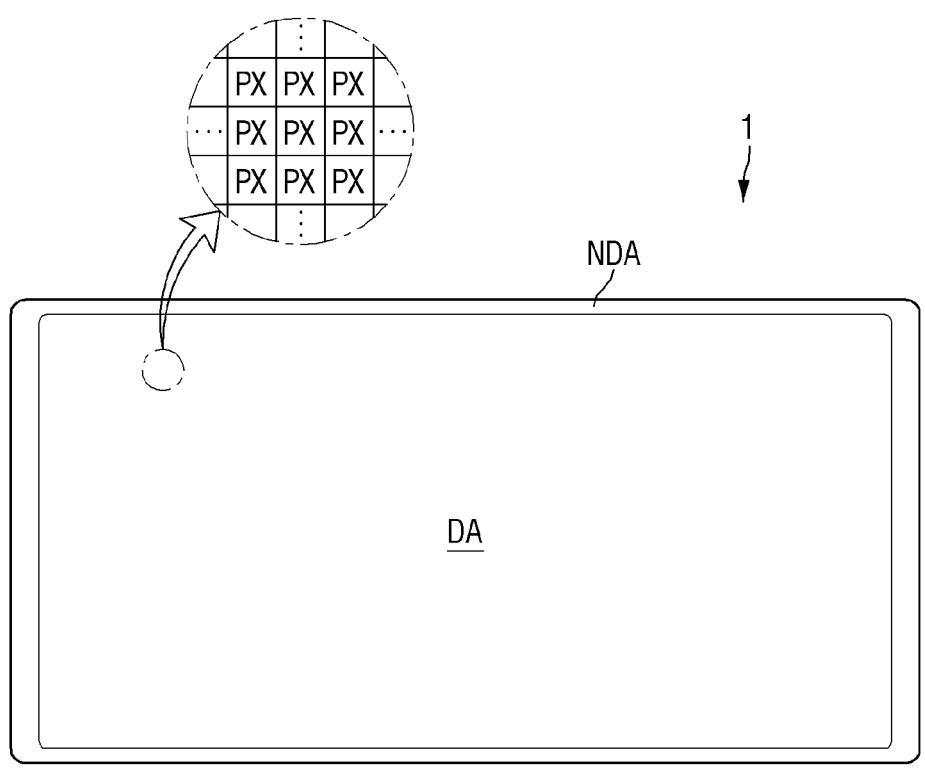
FIG. 1 is a plan view showing a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

In the drawings, sizes and thicknesses of elements may be enlarged for better understanding clarity and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Although terms such as first and second are used to describe various elements, the elements are not limited by such terms. Such terms are merely used to differentiate one element from another element. Therefore, a first element mentioned below may also be a second element within the spirit and scope of the disclosure.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

FIG. 1 is a plan view showing a display device according to an embodiment.

Referring to FIG. 1, the display device 1 may display a moving image or a still image. The display device 1 may refer to any electronic device that provides or includes a display screen. For example, the display device 1 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, and other electronic and display devices within the spirit and scope of the disclosure.

The display device 1 may include a display panel for supporting or displaying a display screen. Examples of the display panel may include an LED display panel, an organic light-emitting display panel, a quantum-dot light-emitting display panel, a plasma display panel, a field emission display panel, and other panels within the spirit and scope of the disclosure. In the following description, an LED display panel may be employed as an example of the display panel 10, but the disclosure is not limited thereto. Any other display panel may be employed within the spirit and scope of the disclosure.

The shape of the display device 1 may be modified in various ways. For example, the display device 1 may have shapes such as a rectangle with longer lateral sides, a rectangle with longer vertical sides, a square, a quadrangle with rounded corners or vertices, other polygons, a circle, and other shapes within the spirit and scope of the disclosure. The shape of a display area DA of the display device 1 may also be similar to the overall shape of the display device 1. FIG. 1 shows the display device 1 in the shape of a rectangle with longer horizontal sides and the display area DA.

The display device 1 may include the display area DA and a non-display area NDA. In the display area DA, images may be displayed. In the non-display area NDA, images may not be displayed. The display area DA may be referred to as an active area, while the non-display area NDA may be referred to as an inactive area.

The display area DA may generally occupy the center of the display device 1. The display area DA may include pixels PX. The pixels PX may be arranged in a matrix shape or form when viewed from the above. The shape of each pixel PX may be, but is not limited to, a rectangle or a square when viewed from the above. Each pixel may have a diamond shape having sides inclined with respect to the first direction DR1.

Figure 2:
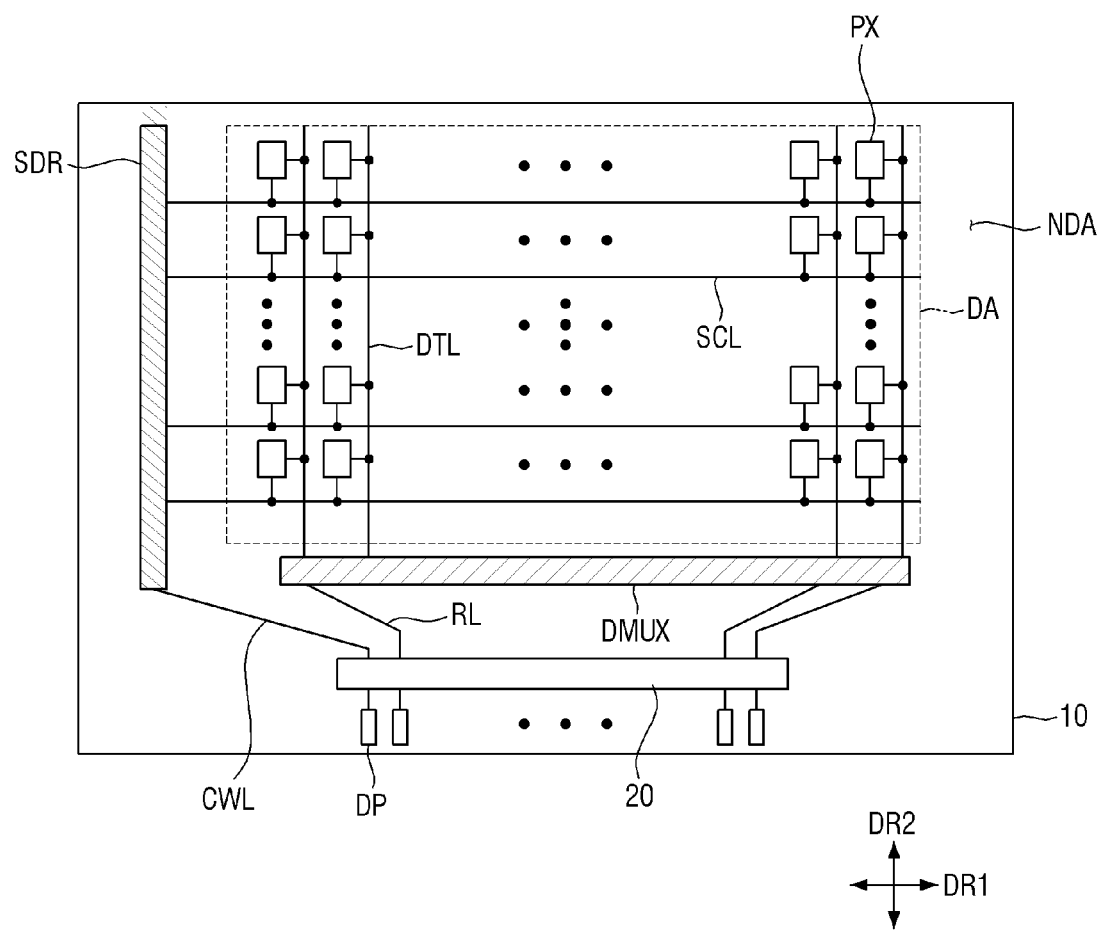
FIG. 2 is a plan view of a display device according to an embodiment.

FIG. 2 is a plan view of a display device according to an embodiment.

Referring to FIG. 2, the display device 1 may include a display panel 10, an integrated circuit driver 20, and a scan driver SDR. The integrated circuit driver 20 may include a timing controller and a data driver.

The display panel 10 may include a display area DA where pixels PX may be formed to display images, and a non-display area NDA which may be the peripheral area of the display area DA. When the display panel 10 includes a curved portion, the display area DA may be located or disposed on the curved portion. When the display panel 10 includes a curved portion and the display area DA is located or disposed on the curved portion, images of the display panel 10 may also be seen on the curved portion.

Scan lines SCL, data lines DTL and power lines connected to the pixels PX may be arranged in the display area DA as well as the pixels PX. The scan lines SCL may be arranged in the first direction DR1, while the data lines DTL may be arranged in the second direction DR2. The embodiment however is not limited thereto. The data lines DTL may be arranged in the first direction DR1, while the scan lines SCL may be arranged in the second direction DR2. The second direction D2 may intersect the first direction DR1. Each of the pixels PX may be connected to at least one of the scan lines SCL and at least one of the data lines DTL.

Each of the pixels may include a driving transistor, at least one switching transistor, a light-emitting element, and a capacitor. Since the switching transistor may be turned on in response to a scan signal from a scan line SCL, the data voltage from the data line DTL may be applied to the gate electrode of the driving transistor. When the data voltage may be applied to the gate electrode, the driving transistor may supply a driving current to the light-emitting element, so that light may be emitted. The driving transistor and the at least one switching transistor may be thin-film transistors. The light-emitting element may emit light in proportion to the driving current from the driving transistor. The light-emitting element may be an organic light-emitting diode including a first electrode, an organic emissive layer, and a second electrode. The capacitor may retain the data voltage that may be applied to the gate electrode of the driving transistor constant.

The non-display area NDA may be defined as the area from the outer side of the display area DA to the edge of the display panel 10. The scan driver SDR for applying scan signals to the scan lines SCL and the data voltage dividing circuit DMUX connected between the data lines DTL and the routing lines RL may be located or disposed in the non-display area NDA. Pads DP electrically connected to the integrated circuit driver 20 may be located or disposed in the non-display area NDA. The integrated circuit driver 20 and the pads DP may be located or disposed at one edge of the display panel 10.

The integrated circuit driver 20 may be connected to the display pads DP to receive digital video data and timing signals. The integrated circuit driver 20 may convert the digital video data into analog positive/negative data voltages and supply them to the data lines DL through the routing lines RL and the data voltage dividing circuit DMUX. The integrated circuit driver 20 may generate and supply a scan control signal for controlling the scan driver SDR through a scan control line CWL. The pixels PX to which the data voltages may be supplied may be selected by the scan signals of the scan driver SDR and the data voltages may be supplied to the selected pixels PX. The integrated circuit driver 20 may supply the supply voltages to the power lines.

The integrated circuit driver 20 may be implemented as an integrated circuit (IC) and may be attached to the display panel 10 in a pad area by a chip on glass (COG) technique, a chip on plastic (COP) technique, or an ultrasonic bonding or other methods within the spirit and scope of the disclosure. For example, the integrated circuit driver 20 may be mounted on a separated circuit board.

The pads DP may be electrically connected to the integrated circuit driver 20. Although not shown in the drawings, the circuit board may be attached to the pads DP with an anisotropic conductive film. In this manner, the lead lines of the circuit board may be electrically connected to the pads DP. The circuit board may be a flexible printed circuit board, a printed circuit board, or a flexible film such as a chip on film. The circuit board may be bent to be located or disposed below the display panel 10. In such case when the circuit board may be bent, a side of the circuit board may be attached to the edge on a side of the display panel 10, and another side thereof may be located or disposed below the display panel 10 to be connected to a system board where a host system may be mounted.

The scan driver SDR may be connected to the integrated circuit driver 20 through at least one scan control line CWL to receive a scan control signal. The scan driver SDR may generate scan signals according to the scan control signal and may sequentially output the scan signals to the scan lines SCL. Although the scan driver SDR may be formed on a side of the display area DA, for example, in the non-display area on the left side of the display area DA in FIG. 2, the disclosure is not limited thereto. For example, the scan driver SDR may be formed on both sides of the display area DA, for example, in the non-display area NDA on the left side as well as the right side of the display area DA.

The data voltage dividing circuit DMUX may be connected between the routing lines RL and the data lines DTL. The number of routing lines RL and the number of data lines DTL connected to the data voltage dividing circuit DMUX may be 1: q, where q is an integer equal to or greater than two. The data voltage dividing circuit DMUX may distribute data voltages applied to a single routing line RL over multiple data lines DTL.

The power supply circuit may generate voltages required for driving the display panel 10 from a main power source applied from the system board and may supply the voltages to the display panel 10. For example, the power supply circuit may generate a first supply voltage and a second supply voltage for driving the light-emitting elements EL of the display panel 10 from the main power source and may supply them to a first voltage line ELVDL and a second voltage line ELVSL of the display panel 10 (see FIG. 3). For example, the power supply circuit may generate driving voltages for driving the integrated circuit driver 20 and the scan driver SDR from the main power source.

The power supply circuit may be implemented as, but is not limited to, an integrated circuit and may be mounted on a circuit board. For example, the power supply circuit may be formed integrally with the integrated circuit driver 20.

Figure 3:
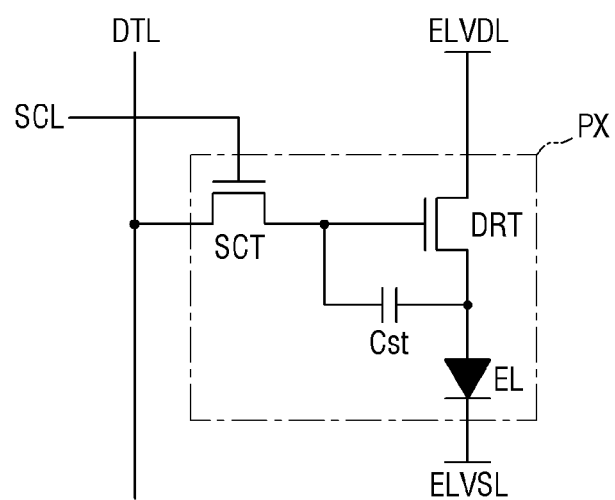
FIG. 3 is an equivalent circuit diagram of one of the pixels of FIG. 2.

FIG. 3 is an equivalent circuit diagram of one of the pixels of FIG. 2.

Referring to FIG. 3, the pixel PX may include a driving transistor DRT, a first switching transistor SCT, a light-emitting element EL, and a capacitor Cst. Although FIG. 3 shows that the pixel PX has a 2T1C (2 transistor-1 capacitor) structure having one driving transistor DRT, one first switching transistor SCT and one capacitor Cst, the disclosure is not limited thereto. The pixel PX may include a greater number of or any number of transistors and more than one capacitor.

Each of the driving transistor DRT and the first switching transistor SCT may include a first electrode, a second electrode, and a gate electrode. One of the first electrode and the second electrode may be a source electrode and the other may be a drain electrode.

Each of the driving transistor DRT and the first switching transistor SCT may be implemented as a thin-film transistor. Although FIG. 3 shows that each of the driving transistor DRT and the first switching transistor SCT may be implemented as an n-type MOSFET (metal oxide semiconductor field effect transistor), the disclosure is not limited thereto. The driving transistor DRT and the first switching transistor SCT may be implemented as a p-type MOSFET. For example, the positions of the source electrode and the drain electrode of each of the driving transistor DRT and the first switching transistor SCT may be changed. In the following description, n-type MOSFETs may be employed as the driving transistor DRT and the first switching transistor SCT.

When the data voltage may be applied to the gate electrode, the driving transistor DRT may supply a driving current to the light-emitting element EL, so that light may be emitted. The gate electrode of the driving transistor DRT may be connected to the source electrode of the first switching transistor SCT, the source electrode may be connected to a first electrode of the light-emitting element EL, and the drain electrode may be connected to the first supply voltage line ELVDL from which a first supply voltage may be applied.

The first switching transistor SCT may be turned on in response to a scan signal from a scan line SCL, such that the data voltage from the data line DTL may be applied to the gate electrode of the driving transistor DRT. The gate electrode of the first switching transistor SCT may be connected to the scan line SCL, the source electrode may be connected to the gate electrode of the driving transistor DRT, and the drain electrode may be connected to the data line DTL.

The capacitor Cst may be connected between the gate electrode and the source electrode of the driving transistor DRT. Accordingly, the capacitor Cst may maintain the data voltage applied to the gate electrode of the driving transistor DRT constant.

The light-emitting element EL may emit light in proportion to the driving current from the driving transistor DT. The light-emitting element EL may be an organic light-emitting diode including a first electrode, an organic emissive layer, and a second electrode. The first electrode of the light-emitting element EL may be connected to the source electrode of the driving transistor DRT, and the second electrode may be connected to the second supply voltage line ELVSL from which a second supply voltage lower than the first supply voltage may be applied.

Figure 4:
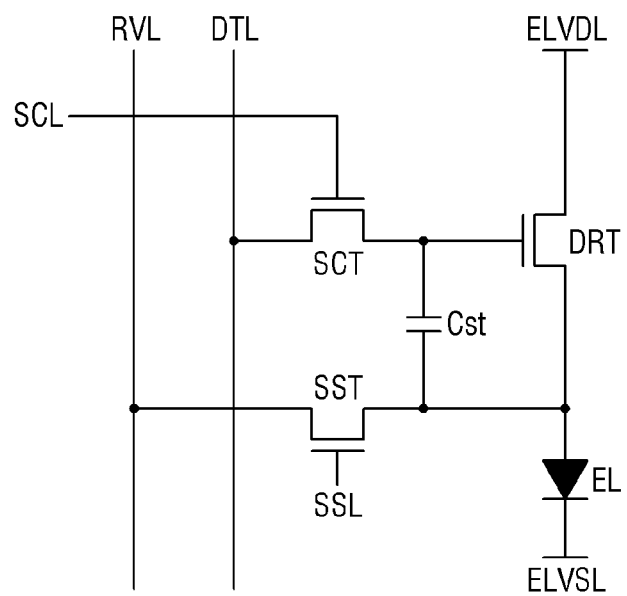
FIG. 4 is an equivalent circuit diagram showing one of the pixels of FIG. 2.

FIG. 4 is an equivalent circuit diagram showing one of the pixels of FIG. 2.

Referring to FIG. 4, a pixel PX may include a driving transistor DRT, a first switching transistor SCT, a sensing transistor SST, a light-emitting element EL, and a capacitor Cst. FIG. 4 shows that the pixel PX has a 3T1C (3 transistor-1 capacitor) structure having one driving transistor DRT, one first switching transistor SCT, one sensing transistor SST and one capacitor Cst. The equivalent circuit diagram of FIG. 4 may be substantially similar to the equivalent circuit diagram of FIG. 3 except that the former includes the sensing transistor SST and a reference line RVL.

The circuit shown in FIG. 4 may include a compensation circuit including the sensing transistor SST and the reference line RVL. The compensation circuit may be added in each pixel PX to compensate for a threshold voltage of the driving transistor DRT.

The sensing transistor SST may be connected between the source electrode of the driving transistor DRT and the first electrode of the light-emitting element EL. The gate electrode of the sensing transistor SST may be connected to a sensing signal line SSL, the drain electrode may be connected to the reference line RVL, and the source electrode may be connected to one end of the capacitor Cst. The sensing transistor SST may be turned on by a sensing signal of the sensing signal line SSL and supply a reference voltage transmitted through the reference line RVL to the source electrode of the driving transistor DRT or senses the voltage or current at the source electrode of the driving transistor DRT.

The reference line RVL may be connected to the scan driver SDR. The scan driver SDR may sense the source electrode of the driving transistor DRT of each pixel PX in real time, during a non-display period of an image or 'n' frames, where 'n' is an integer of 1 or greater. The first switching transistor SCT and the sensing transistor SST may be turned on at the same time. When the first switching transistor SCT and the sensing transistor SST may be turned on at the same time, the sensing operation through the reference line RVL and the data output operation for outputting a data signal may be separated from each other according to the time division scheme of the scan driver SDR.

As an example, a digital data signal, an analog data signal, or a gamma may be compensated depending on the sensing results. The compensation circuit for generating a compensation signal based on the sensing results may be implemented in the scan driver SDR, in the timing controller, or as a separate circuit.

It is, however, to be understood that the disclosure is not limited thereto. Although the pixel PX having the 2T1C structure and the 3T1C structure have been described as an example in FIGS. 3 and 4, the pixel PX may include a greater number or any number of transistors or capacitors. Description thereof will be omitted in so far as the description of FIGS. 3 and 4 applies to a greater number or any number of transistors or capacitors.

Hereinafter, the structure and arrangement of the transistors located or disposed in each of the pixels PX will be described.

Figure 5:
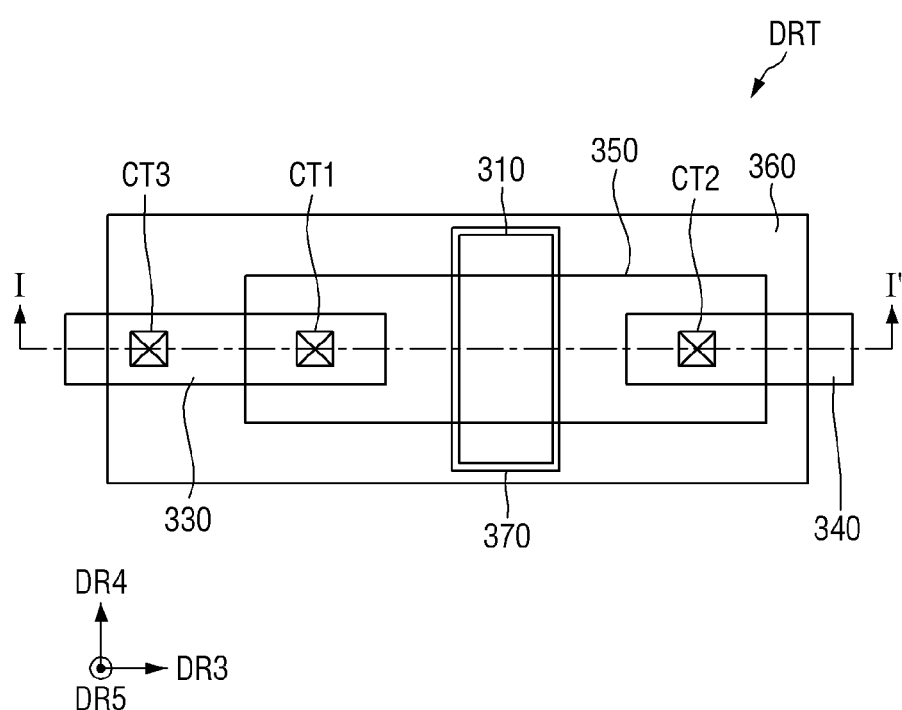
FIG. 5 is a plan view illustrating a driving transistor according to an embodiment.
Figure 6:
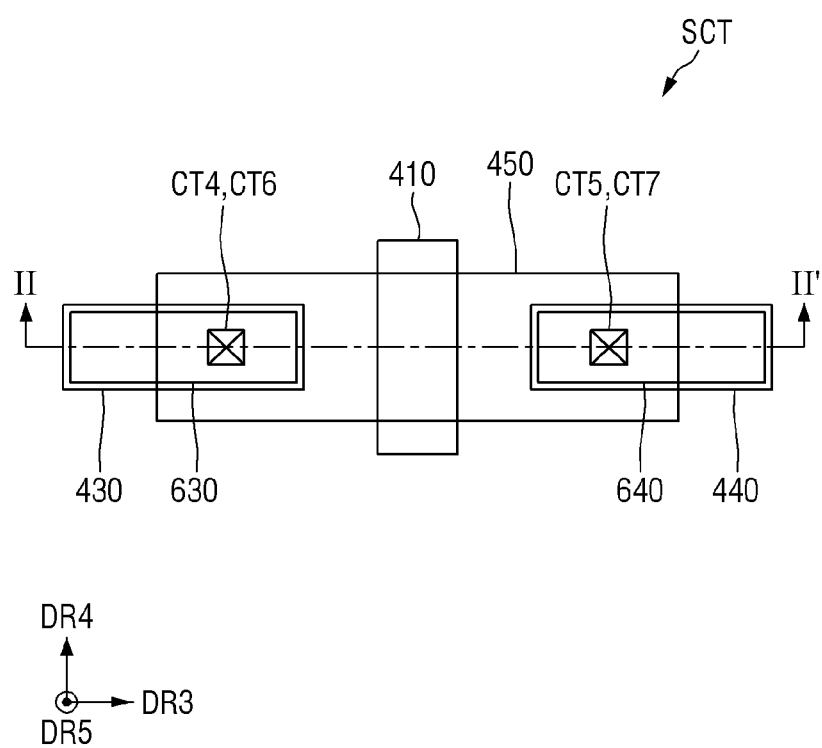
FIG. 6 is a plan view showing a first switching transistor according to an embodiment.
Figure 7:
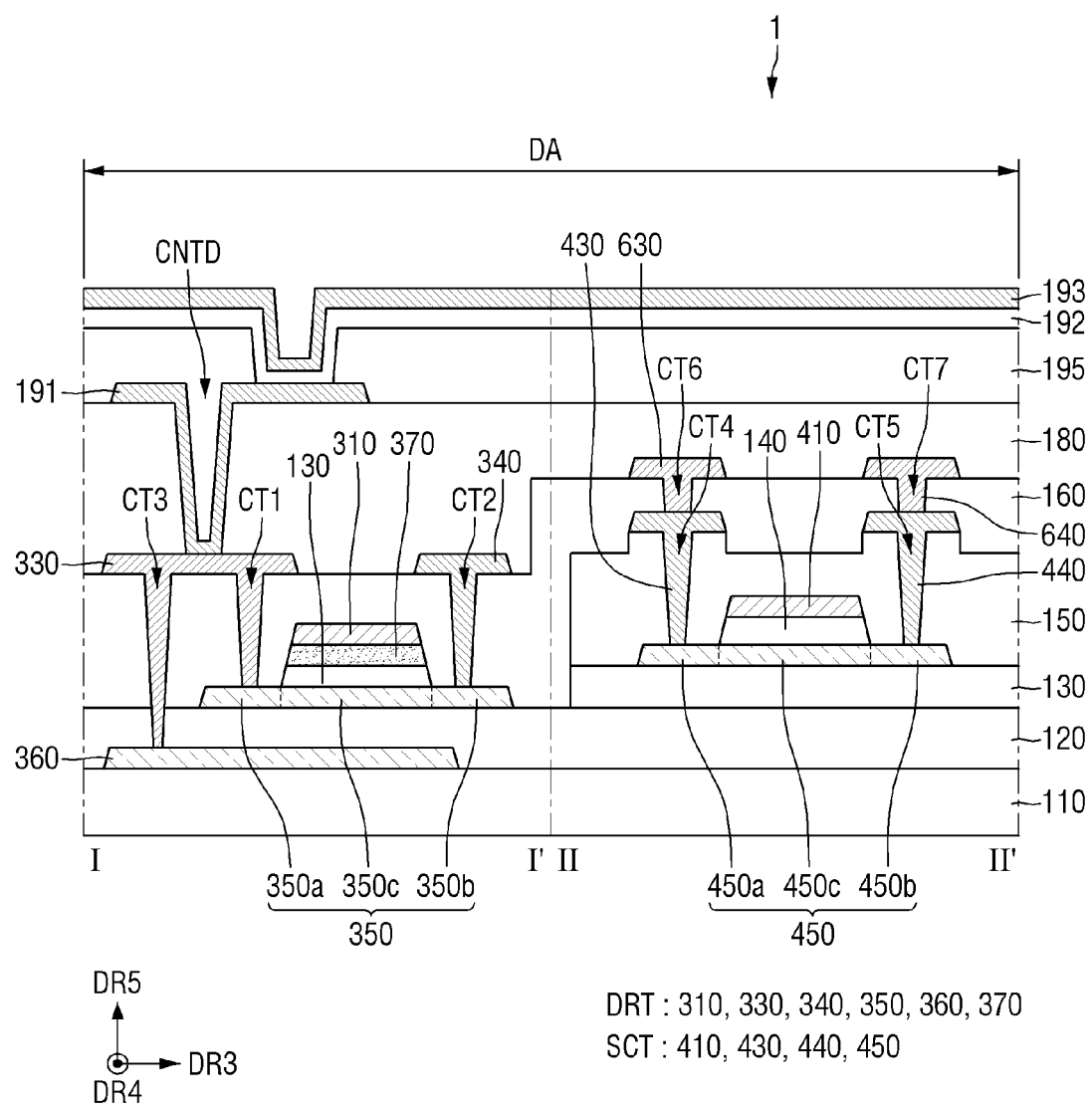
FIG. 7 is a schematic cross-sectional view taken along line I-I' of FIG. 5 and line II-II' of FIG. 6.

FIG. 5 is a plan view illustrating a driving transistor according to an embodiment. FIG. 6 is a plan view showing a switching transistor according to an embodiment. FIG. 7 is a schematic cross-sectional view taken along line I-I' of FIG. 5 and line II-II' of FIG. 6.

Referring to FIGS. 5 to 7, the display panel 10 may include conductive layers and semiconductor layers. The display panel 10 may include a first substrate 110, a buffer layer 120, a first gate insulating layer 130, a second gate insulating layer 140, a driving transistor DRT, a first switching transistor SCT, a first interlayer insulating layer 150, a passivation layer 160, a first planarization layer 180, a first electrode 191, an organic emission layer 192, a second electrode 193, a bank layer 195, and an encapsulation layer.

In the example shown in FIGS. 5 to 7, the driving transistor DRT and the first switching transistor SCT of the pixel PX may have a coplanar structure. The coplanar structure may have a top-gate structure in which a gate electrode may be formed above an active layer. It is, however, to be understood that the disclosure is not limited thereto. The driving transistor DRT and the first switching transistor SCT in each of the pixels PX may have a bottom-gate structure in which a gate electrode may be formed below an active layer. Hereinafter, the driving transistor DRT and the first switching transistor SCT will be described in detail.

According to an embodiment, pixels PX may be located or disposed in the display area DA of the display panel 10, and each of the pixels PX may include a driving transistor DRT and a first switching transistor SCT. The driving transistor DRT of each of the pixels PX may include a first active layer 350, a first oxide layer 370, a first gate electrode 310, a first source electrode 330, and a first drain electrode 340. The first switching transistor SCT of the pixel PX may include a second active layer 450, a second gate electrode 410, a second source electrode 430, and a second drain electrode 440. Each pixel PX may include a first conductive pattern 630 that may be in contact with the second source electrode 430 of the first switching transistor SCT and a second conductive pattern 640 that may be in contact with the second drain electrode 440.

The display device 1 according to an embodiment may include a first semiconductor layer and a second semiconductor layer each having an oxide semiconductor. The first semiconductor layer may include a first active layer 350, and the second semiconductor layer may include a first oxide layer 370 and a second active layer 450. The oxide semiconductor of the first semiconductor layer may include the same or similar material as the oxide semiconductor of the second semiconductor layer. It is, however, to be understood that the disclosure is not limited thereto. The oxide semiconductor of the first semiconductor layer and the oxide semiconductor of the second semiconductor layer may include different oxide semiconductors.

According to an embodiment, the oxide semiconductor of the first semiconductor layer and the second semiconductor layer may include at least one of indium (In), gallium (Ga), zinc (Zn), tin (Sn) and hafnium (Hf). For example, the oxide semiconductor of the first semiconductor layer and the second semiconductor layer may include indium-tin oxide (ITO), indium-gallium-tin oxide (ITGO), indium-gallium-zinc oxide (IGZO) or indium-gallium-zinc-tin oxide (IGZTO). The first semiconductor layer and the second semiconductor layer may include one of the above-listed oxide semiconductors, and they may include the same or similar semiconductor or different oxide semiconductors. It is, however, to be understood that the disclosure is not limited thereto. Hereinafter, the materials of the first semiconductor layer and the second semiconductor layer will not be again described in so far as these materials have previously been described. The arrangement structure will be described in detail.

The first substrate 110 may provide the area where the driving transistor DRT and the first switching transistor SCT may be formed. The first substrate 110 may be made of plastic or glass.

A light-blocking layer may be located or disposed on the first substrate 110. The light-blocking layer may include at least a first light-blocking layer 360 overlapping or below the first active layer 350 of the driving transistor DRT. The first light-blocking layer 360 may be connected to the first source electrode 330 of the driving transistor DRT, which will be described later.

As an example, the first light-blocking layer 360 may prevent light being incident on first active layer 350 from the first substrate 110 to thereby prevent leakage current flowing in the first active layer 350. The width of the first light-blocking layer 360 measured in one direction may be larger than the width of the first active layer 350 measured in the one direction. It is, however, to be understood that the disclosure is not limited thereto. The width of the first light-blocking layer 360 may be shorter than the width of the first active layer 350 but may be longer than at least the width of a channel region 350c of the first active layer 350. The first light-blocking layer 360 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The buffer layer 120 may be located or disposed on the first substrate 110 and the light-blocking layer. The buffer layer 120 may protect the driving transistor DRT and the first switching transistor SCT of the pixel PX from moisture permeating through the first substrate 110. The buffer layer 120 may be formed of inorganic layers stacked on one another alternately. For example, the buffer layer 120 may be made up of multiple layers in which one or more inorganic layers of a silicon oxide layer (SiOx), a silicon nitride layer (SiNx) and silicon oxynitride (SiON) may be stacked on one another alternately.

The first semiconductor layer may be located or disposed on the buffer layer 120. The first semiconductor layer may include the first active layer 350 of the driving transistor DRT. For example, the first active layer 350 may be located or disposed on the buffer layer 120 to overlap the first light-blocking layer 360.

The first active layer 350 may include a first conductive region 350a, a second conductive region 350b, and a channel region 350c. The channel region 350c may be located or disposed between the first conductive region 350a and the second conductive region 350b. The first and second conductive regions 350a and 350b may be in contact with the source electrode 330 and the drain electrode 340 which will be described later.

The first active layer 350 of the driving transistor DRT may have a large number of carriers as hydrogen may be introduced from the gate insulating layer, for example, the first gate insulating layer 130. As the number of carriers increases in the first active layer 350, the driving transistor DRT may have high mobility, and thus exhibit excellent device characteristics. However, when the first active layer 350 has a large number of carriers, a shift phenomenon of the threshold voltage Vth may occur. The shift phenomenon may become serious depending on the shortness of the length of the channel region 350c of the first active layer 350.

In order to prevent this shift phenomenon, according to an embodiment, the driving transistor DRT may include a first oxide layer 370 located or disposed on the first active layer 350. The first oxide layer 370 may inject oxygen into the first active layer 350 to thereby maintain the carrier concentration of the first active layer 350 at an appropriate level. Accordingly, the driving transistor DRT may exhibit excellent device characteristics even if the channel region 350c of the first active layer 350 is relatively short. A more detailed description thereon will be given later.

The first gate insulating layer 130 may be located or disposed on the first semiconductor layer and the buffer layer 120. The first gate insulating layer 130 may be located or disposed on at least the first active layer 350 and may be located or disposed on the buffer layer 120 as well. For example, the first gate insulating layer 130 may include a portion overlapping the channel region 350c of the first active layer 350, and may be located or disposed also on a portion of the buffer layer that is located or disposed under the second active layer 450 of the first switching transistor SCT. The first oxide layer 370 may be located or disposed on the first gate insulating layer 130 located or disposed to overlap the channel region 350c of the first active layer 350, and the second active layer 450 may be located or disposed on the first gate insulating layer 130 located or disposed on the buffer layer 120. In the display device 1 according to the embodiment, the active layers of the driving transistor DRT and the first switching transistor SCT may be located or disposed on different layers. It is, however, to be understood that the disclosure is not limited thereto. In an embodiment, both of the active layers of the driving transistor DRT and the first switching transistor SCT may be located or disposed on the buffer layer 120.

Although the first gate insulating layer 130 may be located or disposed only on a portion of the upper surface of the first active layer 350 between the first gate electrode 310 and the first active layer 350 in the drawings, the disclosure is not limited thereto. For example, the first gate insulating layer 130 may be formed on the upper and side surfaces of the first active layer 350 and may be located or disposed entirely on the buffer layer 120.

The first gate insulating layer 130 may be formed of an inorganic material such as silicon oxide (SiOx) and silicon nitride (SiNx), or a stack structure thereof. It is, however, to be understood that the disclosure is not limited thereto.

The second semiconductor layer may be located or disposed on the first gate insulating layer 130. According to an embodiment, the second semiconductor layer may include a first oxide layer 370 located or disposed to overlap the second active layer 450 and the first active layer 350.

For example, the second active layer 450 may be located or disposed on a portion of the first gate insulating layer 130 that does not overlap the first active layer 350, for example, on the first gate insulating layer 130 located or disposed on the buffer layer 120. In the display device 1 according to an embodiment, the second active layer 450 of the first switching transistor SCT may be positioned or located or disposed on a layer different from that of the first active layer 350 of the driving transistor DRT. For example, the second active layer 450 may be located or disposed (or directly disposed) on the first gate insulating layer 130. It is, however, to be understood that the disclosure is not limited thereto. The second active layer 450 may be located or disposed (or directly disposed) on the buffer layer 120.

Similar to the first active layer 350, the second active layer 450 may also include a first conductive region 450a, a second conductive region 450b and a channel region 450c. The channel region 450c may be located or disposed between the first conductive region 450a and the second conductive region 450b. The first and second conductive regions 450a and 350b may be in contact with the source electrode 430 and the drain electrode 440 which will be described later.

As the second active layer 450 may be located or disposed at the same level as the first oxide layer 370 located or disposed on the first active layer 350, the oxide layer 370 may not be located or disposed above the second active layer 450. The first switching transistor SCT may not include the first oxide layer 370 in order to achieve excellent device characteristics. A more detailed description thereon will be given below.

The first oxide layer 370 may be located or disposed on the first gate insulating layer 130 located or disposed on the first active layer 350. In other words, the first oxide layer 370 may be located or disposed such that it overlaps a portion of the first active layer 350 in the thickness direction. The first oxide layer 370 may be located or disposed to overlap at least the channel region 350c of the first active layer 350. The width of the first oxide layer 370 measured in a direction may be smaller than the width of the first active layer 350 in the same direction but may be larger than the width of the channel region 350c of the first active layer 350. Although the width of the first oxide layer 370 may be substantially equal to the width of the channel region 350c of the first active layer 350 in the drawings, the disclosure is not limited thereto.

The first oxide layer 370 may include the same or similar material as the second active layer 450 and may be formed via the same process. However, as described above, since the first semiconductor layer and the second semiconductor layer may include the same or similar material or different materials, the first oxide layer 370 may include the same or similar oxide semiconductor as the first active layer 350 or may include a different oxide semiconductor.

According to an embodiment of the disclosure, the first oxide layer 370 may be an oxygen supply layer that injects oxygen (O) into the channel region 350c of the first active layer 350. An oxygen vacancy Vo may be partially formed in the oxide semiconductor depending on the oxygen partial pressure during a deposition process. When an insulating layer is deposited on the oxide semiconductor, hydrogen (H) may be injected into the oxygen vacancy Vo. As a result, the mobility of the oxide semiconductor may be increased. The active layer having the oxide semiconductor may have a large number of oxygen vacancy Vo so that the driving transistor DRT may have a high mobility. When the driving transistor DRT has a high mobility, however, it may be difficult for the driving transistor DRT to ensure the driving voltage for driving each pixel PX because the carrier concentration may be increased too much. For example, the driving voltage may have a narrower range if the first active layer 350 of the driving transistor DRT has a short channel region 350c.

The oxide layer may supply excess oxygen (O) to another adjacent layer, for example, the insulating layer. The excess oxygen (O) supplied to the insulating layer may be injected into the channel region of the oxide semiconductor, and hydrogen (H) permeated into the oxygen vacancy Vo may be discharged back to the insulating layer. As a result, the number of carriers included in the oxide semiconductor is reduced, and thus the range of the driving voltage of the driving transistor DRT may be ensured or widened.

According to an embodiment, the driving transistor DRT may include the first oxide layer 370 located or disposed on the first active layer 350, to thereby improve the device characteristics. As the slope of the curve on the driving voltage-drive current graph decreases, the driving transistor DRT including the first oxide layer 370 may ensure a wider range of driving voltages for driving the light-emitting element EL of the pixel PX.

According to an embodiment, the first oxide layer 370 may be formed such that it may overlap at least the channel region 350c of the first active layer 350 to inject excess oxygen (O) into the channel region 350c of the first active layer 350. As the first oxide layer 370 located or disposed on the first gate insulating layer 130 has a larger width than that of the channel region 350c of the first active layer 350, it may be located or disposed to overlap the entire the channel region 350c. It is, however, to be understood that the disclosure is not limited thereto. As shown in the drawings, the width of the first oxide layer 370 may be substantially identical to the width of the channel region 350c of the first active layer 350.

As an example, even if the first active layer 350 and the first oxide layer 370 have the same oxide semiconductor, they may have different composition ratios. As the first oxide layer 370 may be located or disposed on the first active layer 350, excess oxygen O of the first oxide layer 370 may be injected into the first active layer 350, and the hydrogen (H) existing in the oxygen vacancy Vo may be discharged. Accordingly, according to an embodiment, the first active layer 350 of the driving transistor DRT may have a higher oxygen content than the first oxide layer 370, and the first oxide layer 370 may have a hydrogen content higher than that of the first active layer. It is, however, to be understood that the disclosure is not limited thereto. When the first semiconductor layer and the second semiconductor layer have different oxide semiconductors, the first active layer 350 and the first oxide layer 370 may have different composition ratios, and thus the first oxide layer 370 may have a higher oxygen content.

For example, even if the first active layer 350 and the second active layer 450 have the same oxide semiconductor, they may have partially different composition ratios. As the first oxide layer 370 may be located or disposed on the first active layer 350, the first active layer 350 may receive oxygen, while the first oxide layer 370 may not be located or disposed on the second active layer 450, and accordingly the second active layer 450 may not receive oxygen. As will be described later, as the first gate insulating layer 130 located or disposed on the first active layer 350 and the second gate insulating layer 140 located or disposed on the second active layer 450 are formed via different processes, the first active layer 350 and the second active layer 450 may have different composition ratios.

According to an embodiment, the first active layer 350 may have a higher content of oxygen (O) than the second active layer 450. As the first oxide layer 370 may be located or disposed above the first active layer 350, oxygen may be injected and hydrogen may be discharged during the fabricating process. On the other hand, as the first oxide layer 370 may not be located or disposed on the second active layer 450, oxygen may be hardly injected and hydrogen may be hardly discharged. Although the first active layer 350 and the second active layer 450 may include the same or similar material and may be formed via the same process, they may have different compositions depending on the first oxide layer 370 located or disposed in a subsequent process. It is, however, to be understood that the disclosure is not limited thereto.

The second gate insulating layer 140 may be located or disposed on the second semiconductor layer. For example, the second gate insulating layer 140 may be located or disposed on the second active layer 450, but may not be located or disposed on the first oxide layer 370. The second gate insulating layer 140 may be located or disposed such that it overlaps at least the channel region 450c of the second active layer 450, and the second gate electrode 410 may be located or disposed thereon.

Although the second gate insulating layer 140 may be located or disposed only on a portion of the upper surface of the second active layer 450 between the second gate electrode 410 and the second active layer 350 in the drawings, the disclosure is not limited thereto. For example, the second gate insulating layer 140 may be formed on the upper surface as well as the side surfaces of the second active layer 450 and may be located or disposed entirely on the buffer layer 120. The second gate insulating layer 140 may be formed of an inorganic material such as silicon oxide (SiOx) and silicon nitride (SiNx), or a stack structure thereof. It is, however, to be understood that the disclosure is not limited thereto.

As described above, the active layers 350 and 450 of the driving transistor DRT and the first switching transistor SCT may be required to have different physical properties in order to exhibit different device characteristics. For example, the driving transistor DRT may have a high mobility as a large amount of hydrogen is introduced therein, and may further include the first oxide layer 370 to ensure a wide range of driving voltage even though the driving transistor DRT has a short channel region 350c.

On the other hand, the first switching transistor SCT can exhibit better device characteristics as the second active layer 450 has a small amount of oxygen vacancy Vo. The second gate insulating layer 140 located or disposed on the second active layer 450 may have a material for reducing the amount of hydrogen introduced into the second active layer 450 or may be formed via a process.

According to an embodiment, the first oxide layer 370 may not be located or disposed on the second active layer 450, and the first gate insulating layer 130 located or disposed on the first active layer 350 and the second gate insulating layer 140 located or disposed on the second active layer 450 may be formed via different deposition processes.

Although the first gate insulating layer 130 and the second gate insulating layer 140 include substantially the same material, it may be possible to adjust and the amount of hydrogen introduced into the active layers 350 and 450 by adjusting the conditions of the deposition process for forming the active layers 350 and 450. The smaller the amount of hydrogen flowing into the second active layer 450 from the second gate insulating layer 140, the better device characteristics the first switching transistor SCT can exhibit.

Figure 8:
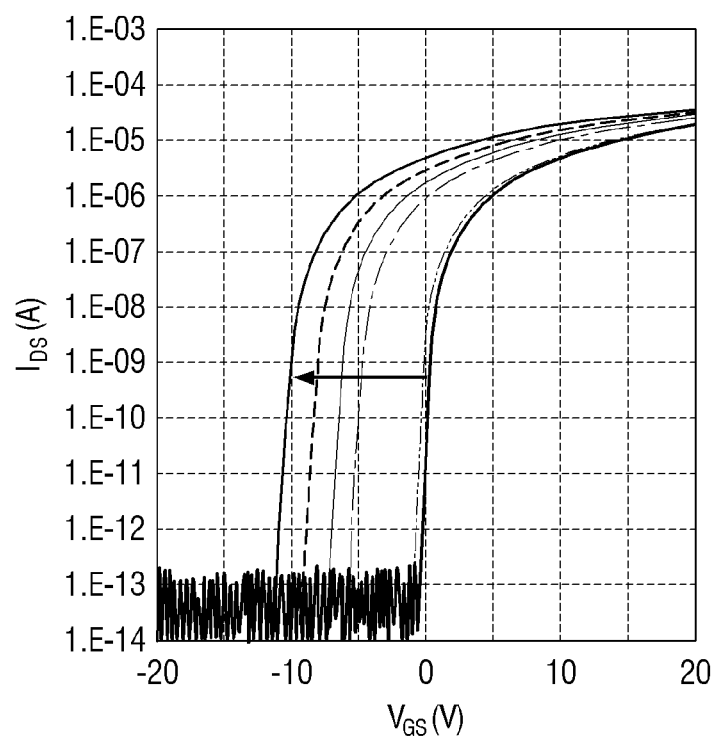
FIGS. 8 to 9 are graphs showing the driving current according to the gate voltage of first switching transistors according to an embodiment.
Figure 9:
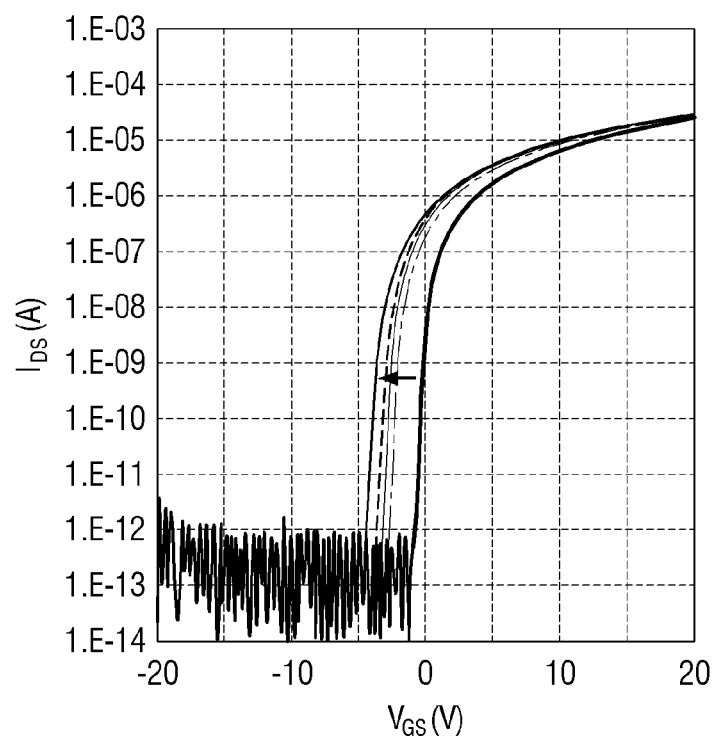

FIGS. 8 to 9 are graphs showing the driving current according to the gate voltage of first switching transistors according to an embodiment.

FIG. 8 is a graph showing driving current Ids according to gate voltage Vgs of a first switching transistor SCT fabricated via a process of depositing a gate insulating layer in which a large amount of hydrogen is introduced into the second active layer 450 of the first switching transistor SCT. FIG. 9 is a graph showing driving current Ids according to gate voltage Vgs of a first switching transistor SCT fabricated via a process of depositing a gate insulating layer in which a small amount of hydrogen is introduced into the second active layer 450 of the first switching transistor SCT. FIGS. 8 and 9 show changes in the driving current Ids after the gate voltage Vgs of the first switching transistor SCT has been swept several times.

Referring initially to FIG. 8, when a large amount of hydrogen is introduced into the second active layer 450 of the first switching transistor SCT, the curves of the driving current Ids are shifted to the left even after the gate voltage Vgs has been swept several times (negative shift). When this happens, the threshold voltage Vth of the first switching transistor SCT is changed, and thus device reliability may be lowered, and even the device characteristics as a switching transistor may be lost later on.

On the contrary, referring to FIG. 9, it can be seen that when a small amount of hydrogen is introduced into the second active layer 450 of the first switching transistor SCT, the curves of the driving current Ids are shifted less to the left even after the gate voltage Vgs has been swept several times. In other words, the change in the through voltage Vth of the first switching transistor SCT may be reduced, and thus the device reliability may be ensured.

According to an embodiment, the first gate insulating layer 130 located or disposed on the first active layer 350 of the driving transistor DRT and the second gate insulating layer 140 located or disposed on the second active layer 450 of the first switching transistor SCT may be formed via different processes, and accordingly the first gate insulating layer 130 and the second gate insulating layer 140 may be located or disposed on different layers. Furthermore, the first gate insulating layer 130 and the second gate insulating layer 140 may be formed under different process conditions, thereby improving device characteristics and reliability of the first switching transistor SCT. The first oxide layer 370 may be located or disposed on the first gate insulating layer 130, and accordingly the driving transistor DRT may achieve a wide range of driving voltages.

Referring back to FIGS. 5 to 7, a first conductive layer may be located or disposed on the second gate insulating layer 140. For example, the first conductive layer may include a second gate electrode 410 located or disposed on the second gate insulating layer 140. The second gate electrode 410 may overlap the second active layer 450 with the second gate insulating layer 140 interposed therebetween. For example, the second gate electrode 410 may overlap the channel region 450c of the second active layer 450. The width of the second gate electrode 410 is not particularly limited herein as long as it can overlap the channel region 450c of the second active layer 450.

In an embodiment, the second gate electrode 410 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

As will be described later, during the process of fabricating the display device 1, the first gate electrode 310 of the driving transistor DRT and the second gate electrode 410 of the first switching transistor SCT may be formed via different processes. Accordingly, the first gate electrode 310 and the second gate electrode 410 may be located or disposed on different layers. It is, however, to be understood that the disclosure is not limited thereto. The first gate electrode 310 and the second gate electrode 410 may be located or disposed on the same layer.

A first interlayer insulating layer 150 may be located or disposed on the first conductive layer. For example, the first interlayer insulating layer 150 may be located or disposed on the second gate electrode 410, but may not overlap a portion of the second semiconductor layer. For example, the first interlayer insulating layer 150 may cover a portion of the first gate insulating layer 130, the second active layer 450 and the second gate electrode 410 of the first switching transistor SCT, while exposing the first oxide layer 370 of the driving transistor DRT. Accordingly, a portion of the second conductive layer located or disposed on the first interlayer insulating layer 150 may be located or disposed on the first oxide layer 370 to form the first gate electrode 310. It is, however, to be understood that the disclosure is not limited thereto.

A fourth contact hole CT4 for exposing a portion of the upper surface of the second active layer 450 and a fifth contact hole CT5 for exposing another portion of the upper surface of the second active layer 450 may be formed in the first interlayer insulating layer 150. The fourth contact hole CT4 may expose the first conductive region 450a of the second active layer 450, and the fifth contact hole CT5 may expose the second conductive region 450b of the second active layer 450.

The first interlayer insulating layer 150 may be formed of an inorganic material such as silicon oxide (SiOx) and silicon nitride (SiNx), or a stack structure thereof.

According to an embodiment, some portions of the upper surface of the first interlayer insulating layer 150 may protrude from other portions of the first interlayer insulating layer 150. In other words, some portions of the first interlayer insulating layer 150 may be higher than other portions of the first interlayer insulating layer 150. For example, the portions of the first interlayer insulating layer 150 where the fourth contact hole CT4 and the fifth contact hole CT5 may be formed may be higher than other portions of the first interlayer insulating layer 150.

As will be described later, the second source electrode 430, the second drain electrode 440 and the first gate electrode 310 may be formed in the process of forming the second conductive layer during the process of fabricating the display device 1. In subsequent processes, the first gate insulating layer 130 may be partially etched to be formed between the first active layer 350 and the first oxide layer 370 and below the first interlayer insulating layer 150, or, to be formed only between the first active layer 350 and the first oxide layer 370 and only below the first interlayer insulating layer 150. During the process of partially etching the first gate insulating layer 130, the first interlayer insulating layer 150 may be etched simultaneously, leaving the portions of the upper surface thereof, e.g., the portions where the second source electrode 430 and the second drain electrode 440 may be formed. By the above-described process, portions of the upper surface of the first interlayer insulating layer 150 may be higher than other portions. It is, however, to be understood that the disclosure is not limited thereto.

A second conductive layer may be located or disposed on the first interlayer insulating layer 150. The second conductive layer may include the second source electrode 430 and the second drain electrode 440 located or disposed on the first interlayer insulating layer 150, and a portion of the second semiconductor layer, for example, the first gate electrode 310 located or disposed on the first oxide layer 370. As described above, the first interlayer insulating layer 150 may be formed to not overlap the first active layer 350 and the first oxide layer 370, and the first gate electrode 310 located or disposed on the first oxide layer 370 may be located or disposed after the first interlayer insulating layer 150 may be formed. In other words, the first gate electrode 310 of the driving transistor DRT may be formed via the same process as the second source electrode 430 and the second drain electrode 440 of the first switching transistor SCT.

The second conductive layer will be described in more detail. The first gate electrode 310 may be located or disposed on the first oxide layer 370. The first gate electrode 310 may overlap the first active layer 350 with the first oxide layer 370 and the first gate insulating layer 130 interposed therebetween. For example, the first gate electrode 310 may overlap at least the channel region 350c of the first active layer 350 in the thickness direction.

The first gate electrode 310 may be located or disposed (or directly disposed) on the first oxide layer 370 such that may overlap the first active layer 350. In other words, the lower surface of the first gate electrode 310 may be in contact with the first oxide layer 370. As described above, the driving transistor DRT may include the first oxide layer 370 located or disposed between the first active layer 350 and the first gate electrode 310, so that a wide range of driving voltage may be ensured even if the channel region 350c is short.

For example, according to an embodiment, the width of the first gate electrode 310 may be at least about equal to the width of the first oxide layer 370. Although the width of the first gate electrode 310 may be substantially equal to the width of the first oxide layer 370 in the example shown in FIG. 5, the disclosure is not limited thereto. In an embodiment, the upper surface of the first oxide layer 370 may be in contact with the first gate electrode 310 while the side surface thereof may not be in contact with the first gate electrode 310 but the side surface may be exposed. The exposed side surface of the first oxide layer 370 may be in contact with a passivation layer 160, which will be described later.

The second source electrode 430 and the second drain electrode 440 of the first switching transistor SCT may be located or disposed on the first interlayer insulating layer 150. The second source electrode 430 may be in contact with the first conductive region 450a formed at a side of the second active layer 450 through the fourth contact hole CT4. The second source electrode 440 may be in contact with the second conductive region 450a formed at another side of the second active layer 450 through the fifth contact hole CT5. As described above, the second source electrode 430 and the second drain electrode 440 may be located or disposed on the first interlayer insulating layer 150, and for example, on the higher portions of the first interlayer insulating layer 150, respectively. It is, however, to be understood that the disclosure is not limited thereto.

The passivation layer 160 may be located or disposed on the second conductive layer. For example, the passivation layer 160 may be located or disposed to cover the first gate electrode 310 of the driving transistor DRT and the second source electrode 430 and the second drain electrode 440 of the first switching transistor SCT.

In the passivation layer 160, a first contact hole CT1 for exposing a portion of the upper surface of the first active layer 350 and a second contact hole CT2 for exposing another portion of the upper surface of the first active layer 350 may be formed. The first contact hole CT1 may expose the first conductive region 350a of the first active layer 350, and the second contact hole CT2 may expose the second conductive region 350b of the first active layer 350.

It is, however, to be understood that the disclosure is not limited thereto. The passivation layer 160 may include any number of contact holes. For example, in the passivation layer 160, a sixth contact hole CT6 for exposing a portion of the upper surface of the second source electrode 430 and a seventh contact hole CT7 for exposing a portion of the upper surface of the second drain electrode 440 may be formed. For example, in the passivation layer 160, a third contact hole CT3 for exposing a portion of the upper surface of the first light-blocking layer 360 may be formed through the passivation layer 160 and the buffer layer 120. It is, however, to be understood that the disclosure is not limited thereto. It is to be understood that the indication of the contact holes as first through seventh is arbitrary. The contact holes may be labeled with any number. The contact holes herein described as first through seventh is for ease of understanding and for convenience. However, the disclosure is not limited thereto.

For example, the first contact hole may be a second, third, fourth, fifth, sixth or seventh contact hole within the spirit and scope of the disclosure.

The passivation layer 160 may be formed of an inorganic material such as silicon oxide (SiOx) and silicon nitride (SiNx), or a stack structure thereof.

A third conductive layer may be located or disposed on the passivation layer 160. The third conductive layer may include at least the first source electrode 330 and the first drain electrode 340. For example, the first source electrode 330 may be in contact with the first conductive region 350*a* formed at a side of the first active layer 350 through the first contact hole CT1. The first drain electrode 340 may be in contact with the second conductive region 350*b* formed at another side of the first active layer 350 through the second contact hole CT2. For example, the first source electrode 330 may be in contact with the first light-blocking layer 360 through a third contact hole CT3.

For example, the third conductive layer may include a conductive pattern connected to the second source electrode 430 and the second drain electrode 440 of the first switching transistor SCT. The conductive pattern may include a first conductive pattern 630 located or disposed on the passivation layer 160 and in contact with the second source electrode 430 through the sixth contact hole CT6, and a second conductive pattern 640 located or disposed on the passivation layer 160 and in contact with the second drain electrode 440 through the seventh contact hole CT7.

According to an embodiment, the display device 1 may include a first switching transistor SCT in which the second drain electrode 440 included in the second conductive layer may be connected to the data line DTL, and a first switching transistor SCT in which the second conductive pattern 640 included in the third conductive layer may be connected to the data line DTL. The second drain electrode 440 of the first switching transistor SCT may be connected to the data line DTL in some of the pixels PX. The second conductive pattern 640 that may be in contact with the second drain electrode 440 may be connected to the data line DTL in other pixels PX. According to an embodiment, the display device 1 may include the pixels PX in which the first switching transistors SCT may be connected to different data lines DTL, so that data signals may be applied to the pixels PX through different data lines DTL, allowing for high-speed driving of the display device 1.

It is, however, to be understood that the disclosure is not limited thereto. The first switching transistors SCT included in the respective pixels PX may receive a data signal through the second conductive pattern 640, or, only through the second conductive pattern 640. For example, according to an embodiment, the second conductive pattern 640 may be eliminated in some of the first switching transistors SCT included in the pixels PX. More detailed description thereon will be given with reference to an embodiment.

As an example, each of the second conductive layer and the third conductive layer may include a conductive pattern or conductive patterns. The conductive patterns may form one electrode and another electrode of the storage capacitor CST of each pixel PX, respectively.

Figure 10:
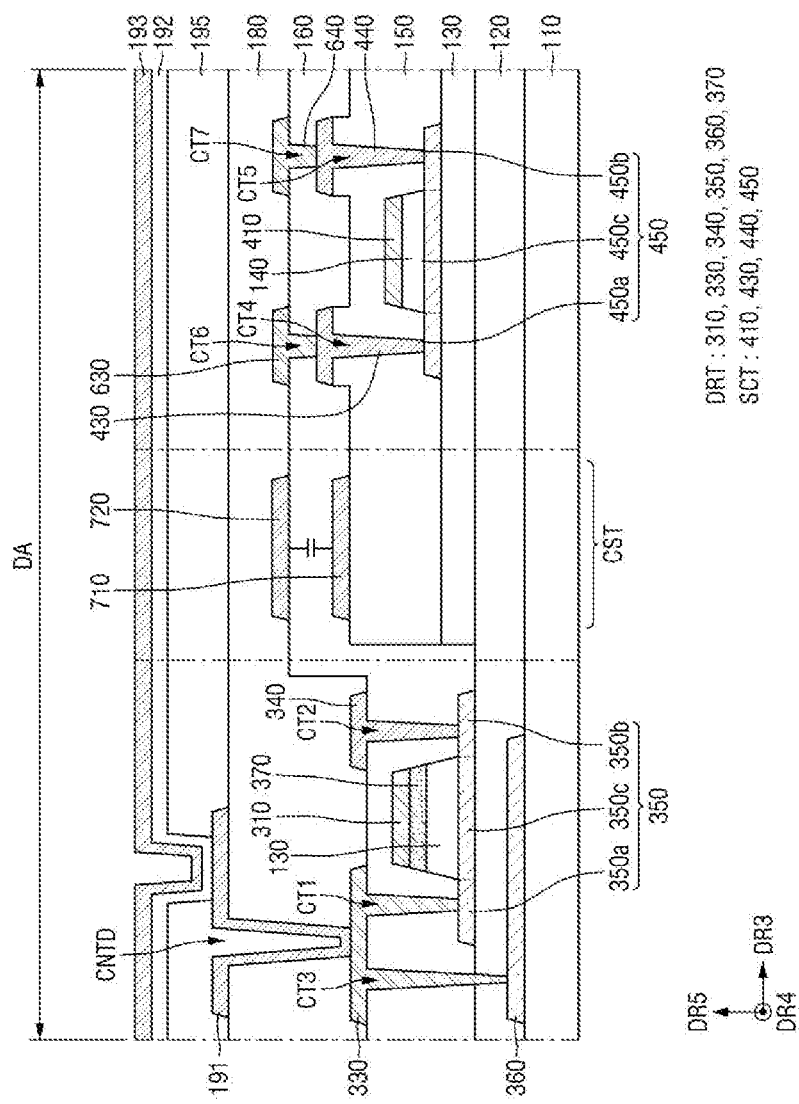
FIG. 10 is a schematic cross-sectional view showing a portion of a display device according to an embodiment.

FIG. 10 is a schematic cross-sectional view showing a display device according to an embodiment.

FIG. 10 shows another portion of each pixel PX in addition to the schematic cross-sectional view shown in FIG. 7. Referring to FIG. 10, a second conductive layer of the display device 1 may include a third conductive pattern 710, and a third conductive layer may further include a fourth conductive pattern 720 overlapping the third conductive pattern 710 in the thickness direction. The third conductive pattern 710 may be located or disposed on the first interlayer insulating layer 150 together with the second source electrode 430, and the fourth conductive pattern 720 may be located or disposed on the passivation layer 160 together with the first source electrode 330. The third conductive pattern 710 and the fourth conductive pattern 720 may overlap each other in the thickness direction with the passivation layer 160 therebetween. Accordingly, a storage capacitor CST of each pixel PX may be formed between them. The third conductive pattern 710 may be one electrode of the storage capacitor CST, and the fourth conductive pattern 720 may be the other electrode of the storage capacitor CST.

It is, however, to be understood that the disclosure is not limited thereto. Each electrode of the storage capacitor CST may not necessarily be located or disposed on the first interlayer insulating layer 150 and the passivation layer 160. For example, each electrode of the storage capacitor CST may form the same layer as another conductive layer, for example, the light-blocking layer, the first conductive layer, or the semiconductor layer.

The first planarization layer 180 may be located or disposed on the third conductive layer and the passivation layer 160. The first planarization layer 180 may provide a flat surface over the level difference formed by thin-film transistors such as the driving transistor DRT and the first switching transistor SCT. The first planarization layer 180 may be formed of an organic layer such as an acryl resin, an epoxy resin, a phenolic resin, a polyamide resin or a polyimide resin.

Although the first planarization layer 180 may be located or disposed (or directly disposed) on the third conductive layer in the example shown in FIG. 10, the disclosure is not limited thereto. A protective layer may be located or disposed between the first planarization layer 180 and the passivation layer 160 and between the first planarization layer 180 and the third conductive layer.

A light-emitting element EL including a first electrode 191, an organic emission layer 192 and a second electrode 193 and a bank layer 195 may be formed on the first planarization layer 180.

The first electrode 191 may be formed on the first planarization layer 180. The first electrode 191 may be connected to the source electrode 330 of the driving transistor DRT through an electrode contact hole CNTD penetrating through the passivation layer 160 and the first planarization layer 180.

The bank layer 195 may cover the edge of the first electrode 191 on the first planarization layer 180 in order to separate the pixels from one another. In other words, the bank layer 195 may serve to define the pixels. In each of the pixels P, the first electrode 191, the organic emission layer 192 and the second electrode 193 may be stacked sequentially so that holes from the first electrode 191 and electrons from the second electrode 193 may be combined with each other in the organic emission layer 192 to emit light.

The organic emission layer 192 may be located or disposed on the first electrode 191 and the bank layer 195. The organic emission layer 192 may include a hole transporting layer, a light-emitting layer, and an electron transporting layer. For example, the organic emission layer 192 may be formed in a tandem structure of two or more stacks, in which case a charge generating layer may be formed between the stacks. Although the organic emission layer 192 may be formed over the entire display area DA in the drawings, the disclosure is not limited thereto. In an embodiment, the organic emission layer 192 may be formed partially in line with the first electrode 191 of each pixel PX.

The second electrode 193 may be formed on the organic emission layer 192. The second electrode 193 may be a common layer formed across the pixels.

The light-emitting elements EL may be of the top-emission type, in which light exits upwardly. When the light-emitting elements EL may be of the top-emission type, the first electrode 191 may be made of a metal material having a high reflectivity such as a stack structure of aluminum and titanium (Ti/Al/Ti), a stack structure of aluminum and ITO (ITO/Al/ITO), an APC alloy or a stack structure of APC alloy and ITO (ITO/APC/ITO). The APC alloy may be an alloy of silver (Ag), palladium (Pd) and copper (Cu). As an example, the second electrode 193 may be formed of a transparent conductive material (TCP) such as ITO and IZO that may transmit light, or a semi-transmissive conductive material such as magnesium (Mg), silver (Ag) or an alloy of magnesium (Mg) and silver (Ag). When the second electrode 193 may be formed of a semi-transmissive conductive material, the light extraction efficiency may be increased by using microcavities.

An encapsulation layer may be formed on the second electrode 193 to prevent the permeation of oxygen or moisture. The encapsulation layer may include at least one inorganic layer. The inorganic layer may be formed of silicon nitride, aluminum nitride, zirconium nitride, titanium nitride, hafnium nitride, tantalum nitride, silicon oxide, aluminum oxide, or titanium oxide. For example, the encapsulation layer may include at least one organic layer in order to prevent particles from penetrating through the encapsulation layer to be introduced into the organic emission layer 192 and the second electrode 193. The organic layer may be formed of epoxy, acrylate or urethane acrylate.

The display device 1 according to an embodiment may include a driving transistor DRT including oxide semiconductors and a first switching transistor SCT including one oxide semiconductor. The driving transistor DRT may include the first active layer 350 and the first oxide layer 370, and the first switching transistor SCT may include the second active layer 450. In the driving transistor DRT, the first oxide layer 370 may be located or disposed between the first active layer 350 and the first gate electrode 310, to ensure a wide range of the driving voltage. On the other hand, in the first switching transistor SCT, the first oxide layer 370 may not be located or disposed between the second active layer 450 and the second gate electrode 410, to ensure high electron mobility in the channel region 450c.

The scan driver SDR may include transistors, each of which may be substantially identical to the first switching transistor SCT or the driving transistor DRT in the pixels PX. In other words, each of the second switching transistors included in the scan driver SDR and the data voltage dividing circuit DMUX in the non-display area NDA may be substantially identical to the first switching transistor SCT or the driving transistor shown in FIGS. 6 and 7. The detailed description thereon will be omitted in so far as a description has been previously provided.

Hereinafter, a method of fabricating the display device 1 including the driving transistor DRT and the first switching transistor SCT described above will be described.

Figure 11:
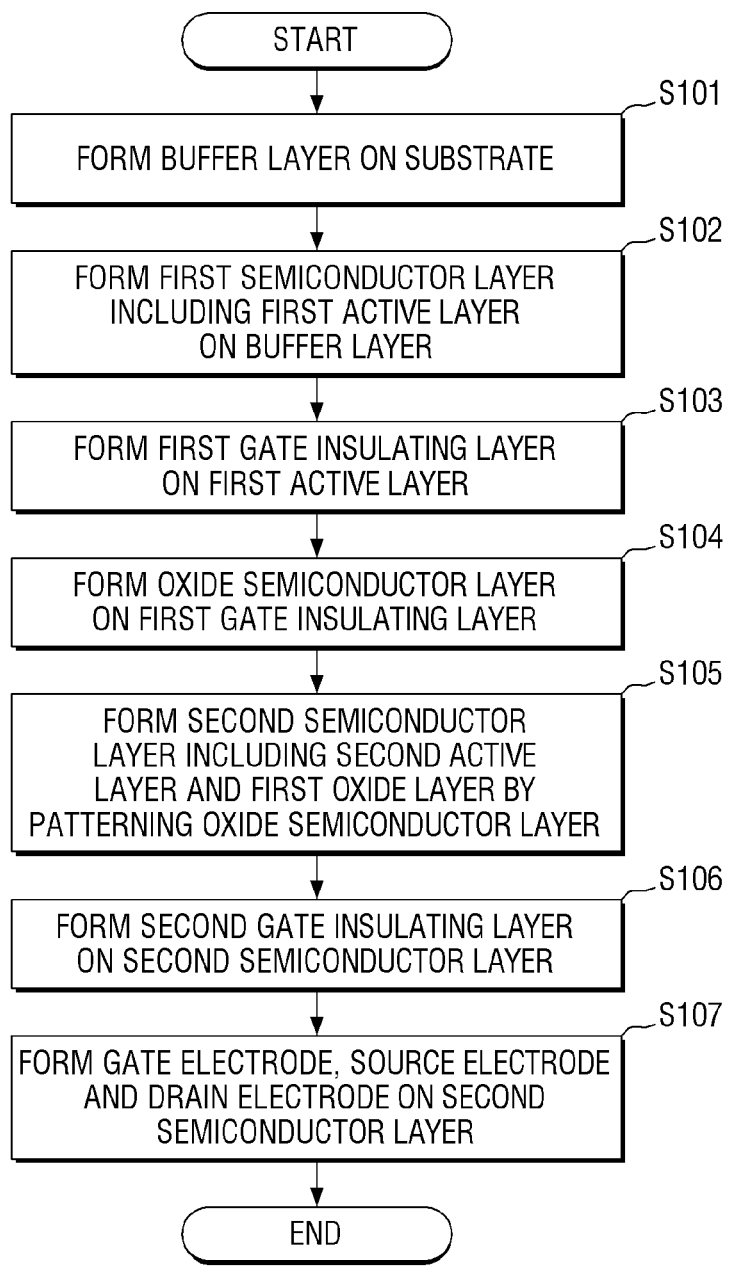
FIG. 11 is a flowchart for illustrating process steps for fabricating a display device according to an embodiment.

FIG. 11 is a flowchart for illustrating process steps for fabricating a display device according to an embodiment.

Referring to FIG. 11, the process of fabricating the display device 1 according to an embodiment may include forming a buffer layer on a substrate (step S101), forming a first semiconductor layer (including a first active layer) on the buffer layer, forming a first gate insulating layer 130 on the first active layer (steps S102 and S103), forming an oxide semiconductor layer on the first gate insulating layer (step S104), forming a second semiconductor layer (including a second active layer) and a first oxide layer, and forming a second gate insulating layer 140 on the second semiconductor layer (steps S105 and S106). The step of forming the second semiconductor layer and the first oxide layer may include patterning the oxide semiconductor layer. The method may include forming a gate electrode, source electrode, and drain electrode on the second semiconductor layer (step S107). As described above, the first active layer 350 of the driving transistor DRT and the second active layer 450 of the first switching transistor SCT may be located or disposed on different layers, and the gate insulating layers 130 and 140 located or disposed thereon, respectively, may also be different. Accordingly, the process of forming one of them may be performed separately from the process of forming the other, and the first oxide layer 370 may be formed together with the second active layer 450 via the same process.

Hereinafter, the process steps of fabricating the display device 1 will be described in detail with reference to FIGS. 12-26.

FIGS. 12 to 26 are schematic cross-sectional views showing processing steps of fabricating a display device according to an embodiment of the disclosure.

Referring initially to FIGS. 12 and 13, a light-blocking layer, for example, a first light-blocking layer 360, may be formed on a first substrate 110, and a buffer layer 120 may be formed thereon (step S101). The buffer layer 120 may be formed entirely on the first substrate 110. The buffer layer 120 may be formed by, but is not limited to, chemical vapor deposition. The process for forming the conductive layers and semiconductor layers is not particularly limited herein and any process within the spirit and scope of the disclosure may be employed. In the following description, the description will focus on the formation order and structure of each of elements, while the process for forming them may be omitted in so far as the process has previously been described.

Referring to FIG. 14, a first semiconductor layer may be formed on the buffer layer 120 (step S102). The first semiconductor layer may include a first active layer 350'. The first active layer 350' may be formed by forming a single layer by sputtering and then performing a patterning process using a photoresist. It is, however, to be understood that the disclosure is not limited thereto. In some implementations, the first active layer 350' may be formed by atomic layer deposition. In FIG. 13, neither conductive region nor channel region may be formed in the first active layer 350'. Some portions of the first active layer 350' may become conductive via a subsequent process to form conductive regions and a channel region.

Referring to FIGS. 15 and 16, the first insulating layer 130' may be formed on the first semiconductor layer (step S103), and an oxide semiconductor layer OXL' may be formed on the first insulating layer 130' (step S104). The first insulating layer 130' and the oxide semiconductor layer OXL' may be located or disposed entirely on the buffer layer 120 to cover the first active layer 350' of the first semiconductor layer. A first insulating layer IL1 may be patterned in a subsequent process to form the first gate insulating layer 130, and the oxide semiconductor layer OXL' may form the first oxide layer 370 and the second active layer 450.

Although not shown in the drawings, a heat treatment process may be performed on the oxide semiconductor layer OXL'. The oxide semiconductor layer OXL' may supply oxygen into the first insulating layer 130' located or disposed thereunder during the heat treatment process. It is, however, to be understood that the disclosure is not limited thereto.

Referring to FIG. 17, the oxide semiconductor layer OXL' may be partially etched to form an oxide layer 370' and a second active layer 450'. The oxide layer 370' may be further etched during a subsequent process to form a first oxide layer 370 overlapping the channel region 350c of the first active layer 350. Some portions of the second active layer 450' may become conductive via a subsequent process to form conductive regions and a channel region.

Referring to FIG. 18, a second gate insulating layer 140 may be formed on the second active layer 450', and a second gate electrode 410 may be formed on the second gate insulating layer 140. Although not shown in the drawings, the process of forming the second gate electrode 410 may include disposing the second gate insulating layer 140 and a metal layer on the oxide layer 370' and the second active layer 450, and performing a mask process using a photoresist PR1 thereon. The first photoresist PR1 may serve as a mask for forming the second gate electrode 410. The detailed description thereon will be omitted.

Figure 19:
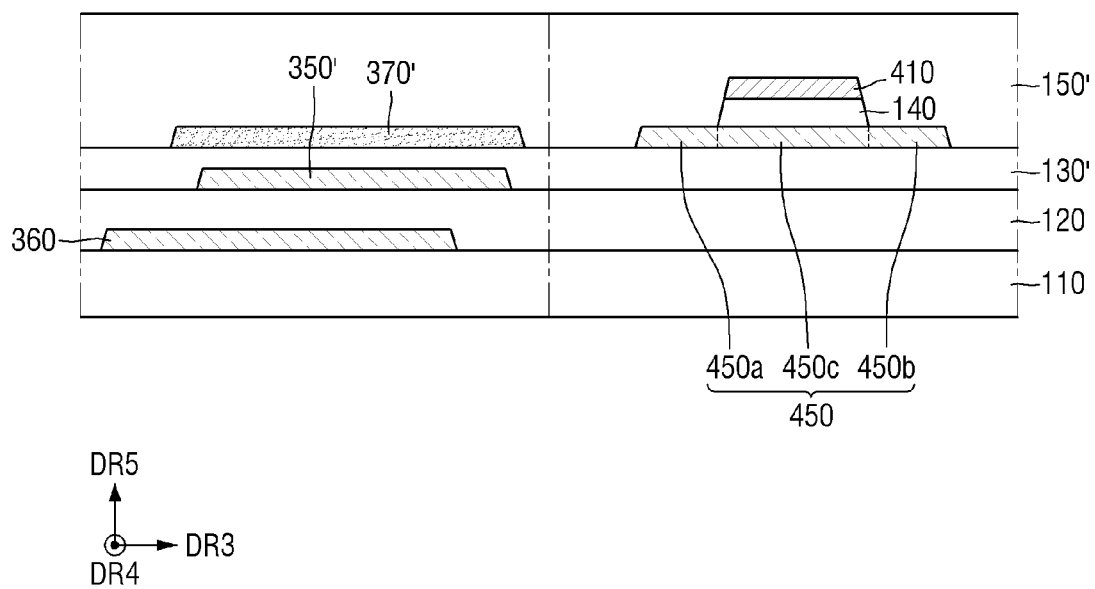

Referring to FIG. 19, some portions of the second active layer 450 are made conductive, and a second insulating layer 150' located or disposed thereon may be formed. The second insulating layer 150' may be patterned during a subsequent process to form the first interlayer insulating layer 150. The second insulating layer 150' may be located or disposed entirely on the first insulating layer 130' including the oxide layer 370' and the second active layer 450.

Figure 20:
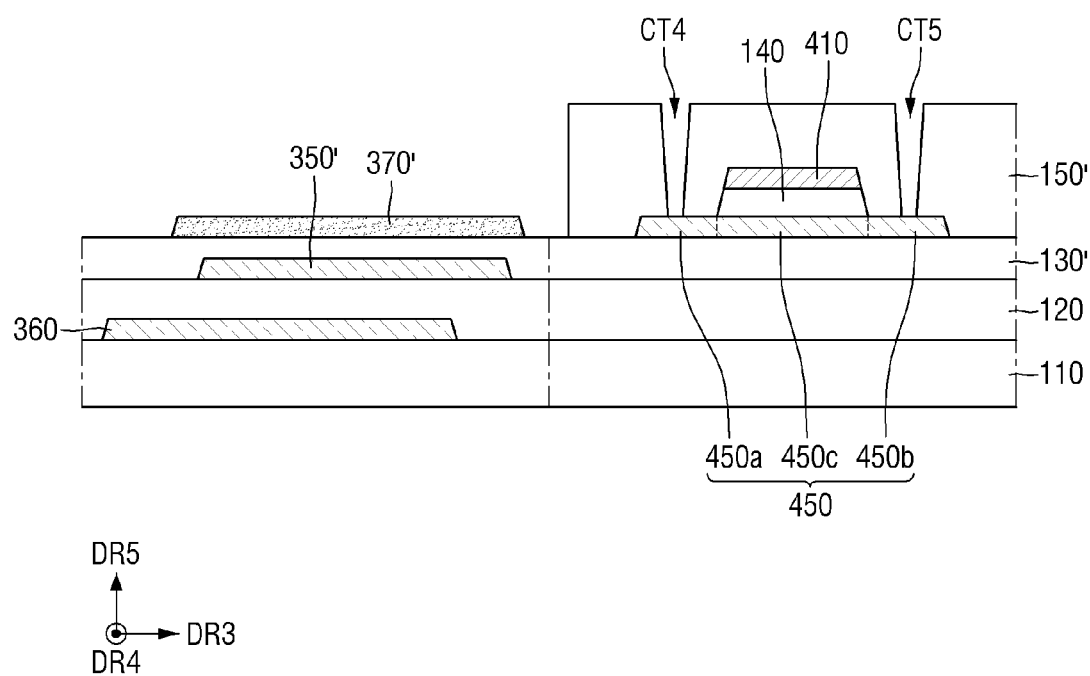

Referring to FIG. 20, a portion of the second insulating layer 150' may be patterned to expose the oxide layer 370', and a fourth contact hole CT4 and a fifth contact may be formed in the second insulating layer 150'. A portion of the upper surface of the second insulating layer 150' may be etched along the second source electrode 430 and the second drain electrode 440 located or disposed in the fourth contact hole CT4 and the fifth contact hole CT5, respectively, to form the first interlayer insulating layer 150.

Figure 21:
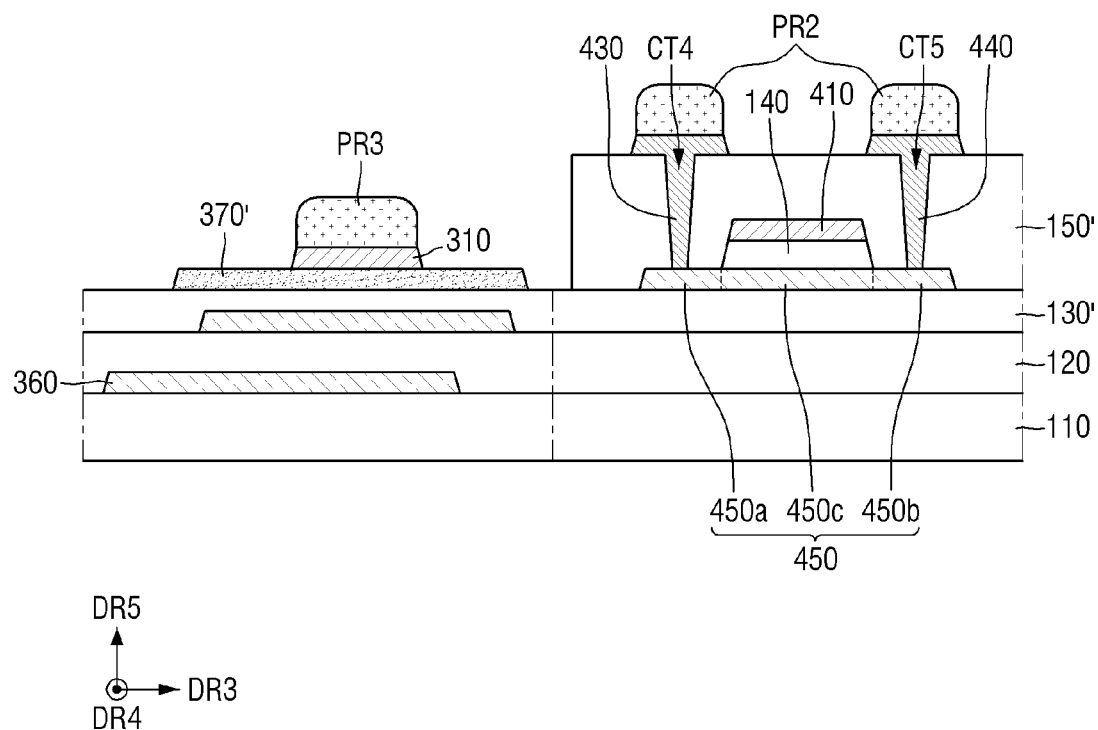

Referring to FIG. 21, a second conductive layer may be formed on the second insulating layer 150' and the oxide layer 370'. The second conductive layer may include a first gate electrode 310, a second source electrode 430, and a second drain electrode 440. The elements may be identical to those described above. Therefore, the redundant description will be omitted. The process of forming the second conductive layer may include forming a metal layer located or disposed entirely on the second insulating layer 150' and the oxide layer 370', and performing a mask process using a second photoresist PR2 and a third photoresist PR3. The second photoresist PR2 may serve as a mask for forming the second source electrode 430 and the second drain electrode 440, and the third photoresist PR3 may serve as a mask for forming the first gate electrode 310. The detailed description thereon will be omitted.

Figure 22:
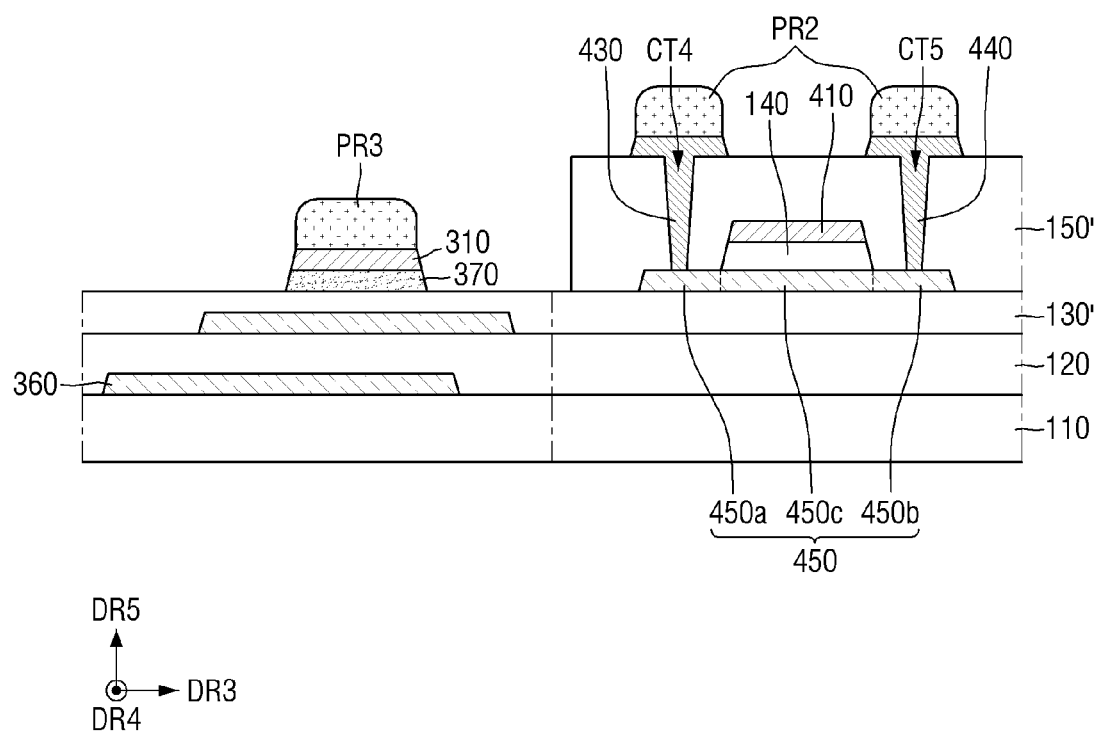
Figure 23:
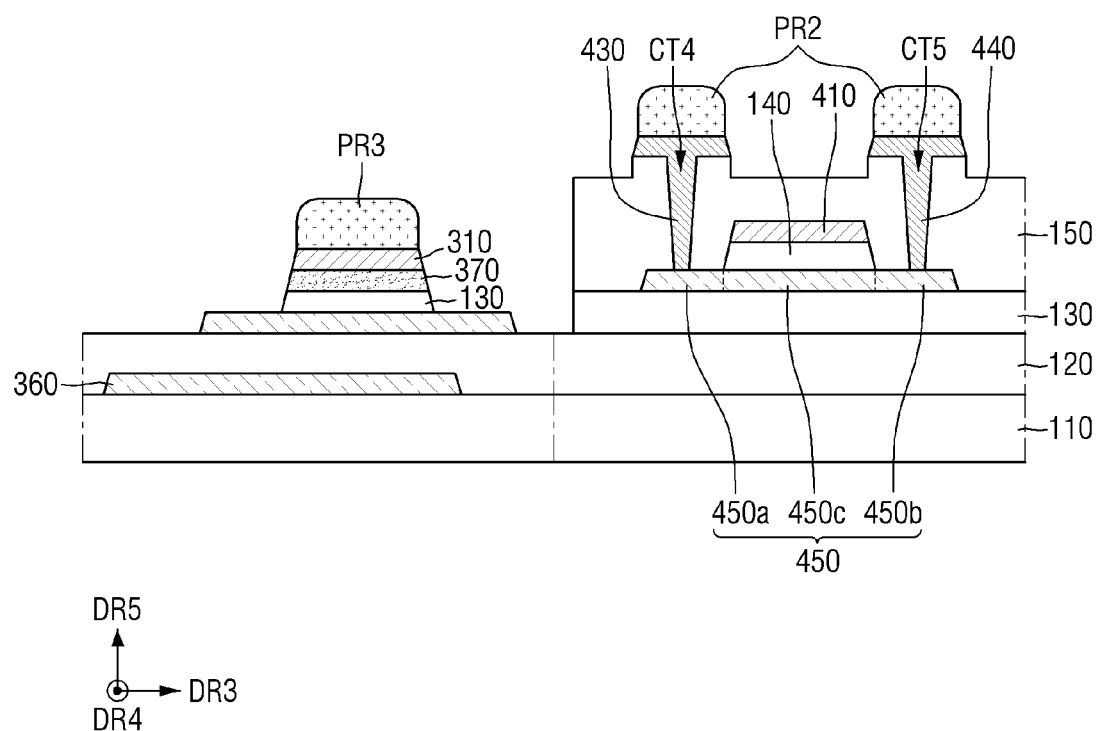

Referring to FIGS. 22 and 23, the oxide layer 370', the first insulating layer 130' and the second insulating layer 150' may be partially etched along the second photoresist PR2 and the third photoresist PR3, to form the first oxide layer 370, the first gate insulating layer 130 and the first interlayer insulating layer 150. As a portion of the upper surface of the second insulating layer 150' may be etched along the second photoresist PR2, the first interlayer insulating layer 150 may be formed. As the oxide layer 370' and the first insulating layer 130' may be etched along the third photoresist PR3, the first oxide layer 370 and the first gate insulating layer 130 may be formed, respectively. The first gate insulating layer 130 may be located or disposed between the first oxide layer 370 and the first active layer 350 and under the first interlayer insulating layer 150 and the second active layer 450.

Figure 24:
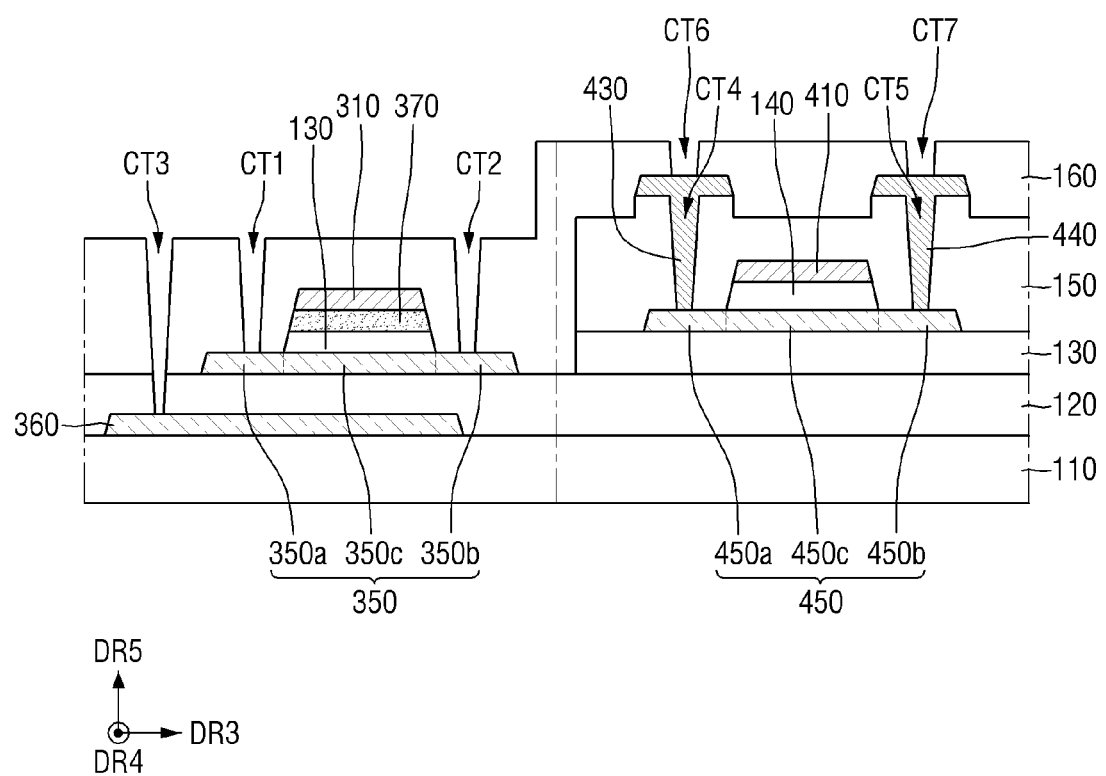
Figure 25:
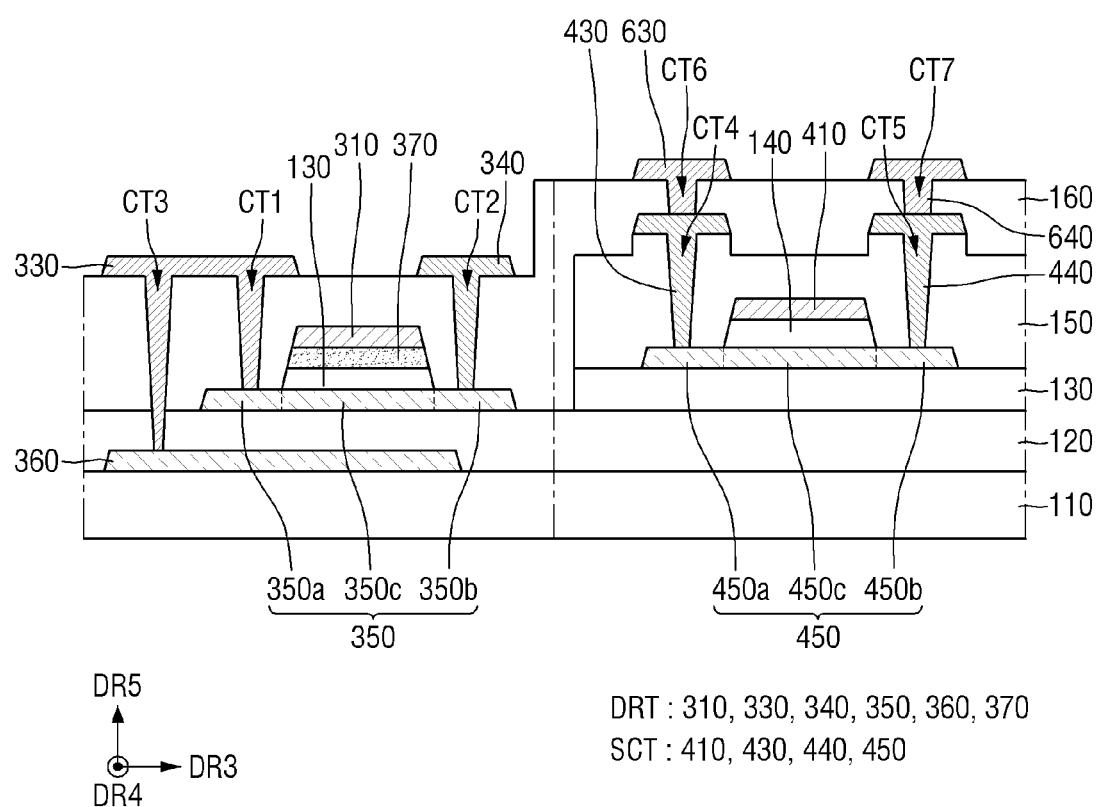

Referring to FIGS. 24 and 25, a passivation layer 160 located or disposed on the second conductive layer and a third conductive layer located or disposed on the passivation layer 160 may be formed. The passivation layer 160 and the third conductive layer have been previously described above.

Figure 26:
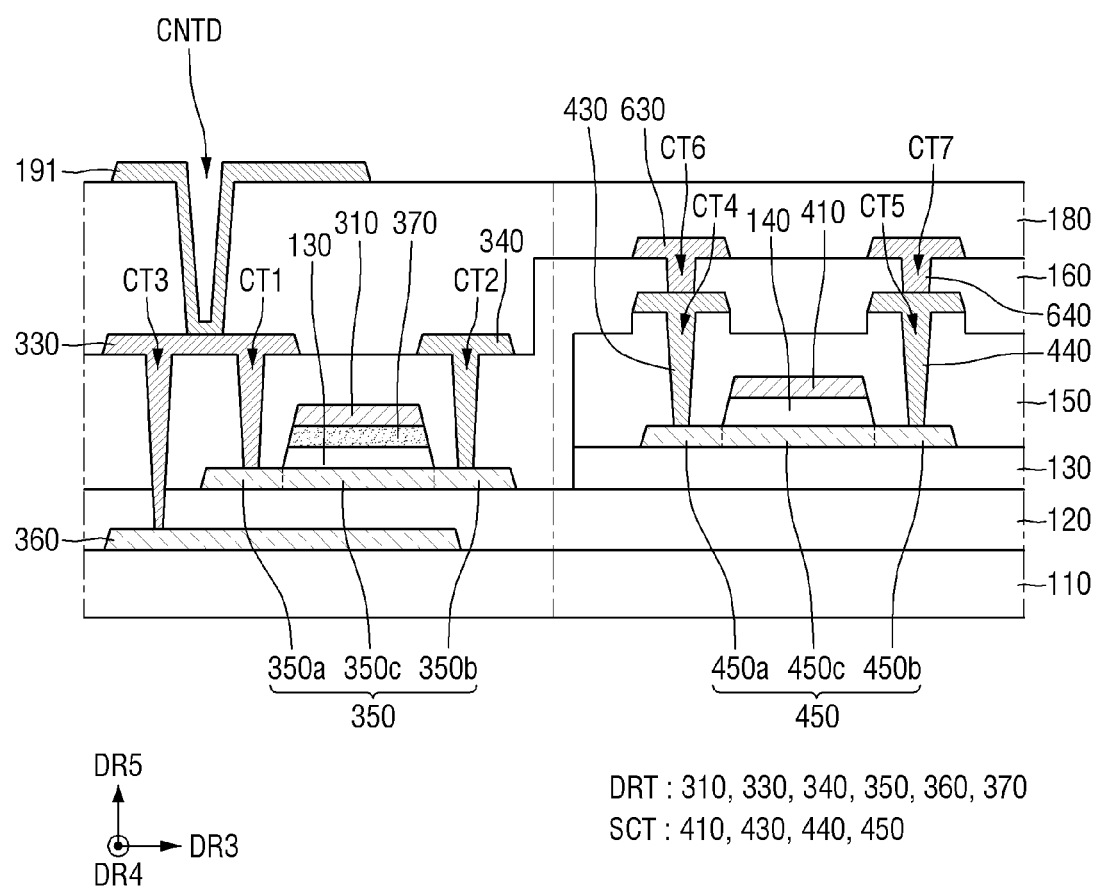

Referring to FIG. 26, a first planarization layer 180 may be formed on the third conductive layer, and an electrode contact hole CNTD exposing the first source electrode 330 may be formed in the first planarization layer 180 and a first electrode may be formed on the first planarization layer 180. Such structures have already been described above. Therefore, the redundant description will be omitted.

Lastly, although not shown in the processes of FIGS. 12-26, an organic emission layer 192, a bank layer 195, a second electrode 193 and an encapsulation layer may be formed on the first electrode 191, to fabricate the display device 1.

By performing the above-described processes, the display device 1 according to the embodiment may be fabricated. The forming the first active layer 350 and the first gate insulating layer 130 and the forming the second active layer 450, the first oxide layer 370 and the second gate insulating layer 140 may be performed at different stages. Accordingly, the first active layer 350 and the second active layer 450 may be located or disposed on different layers, and the first gate insulating layer 130 and the second gate insulating layer 140 may also form different layers. Moreover, the first oxide layer 370 formed together with the second active layer 450 may overlap the first active layer 350, or, may overlap only the first active layer 350. Accordingly, the device characteristics of the driving transistor DRT and the first switching transistor SCT may be improved.

Hereinafter, a variety of structures of the driving transistor DRT and the first switching transistor SCT will be described with reference to other drawings.

Figure 27:
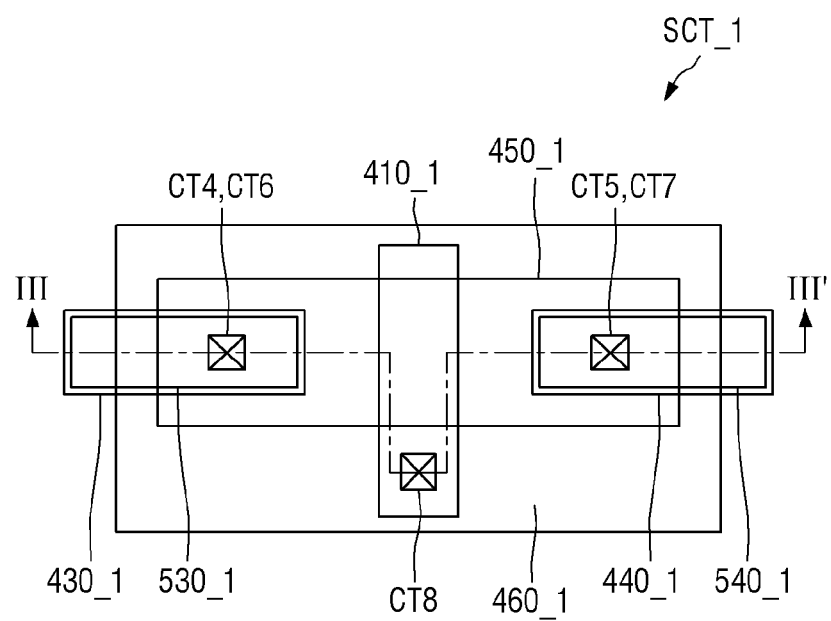
FIG. 27 is a plan view showing a first switching transistor of a display device according to an embodiment.
Figure 28:
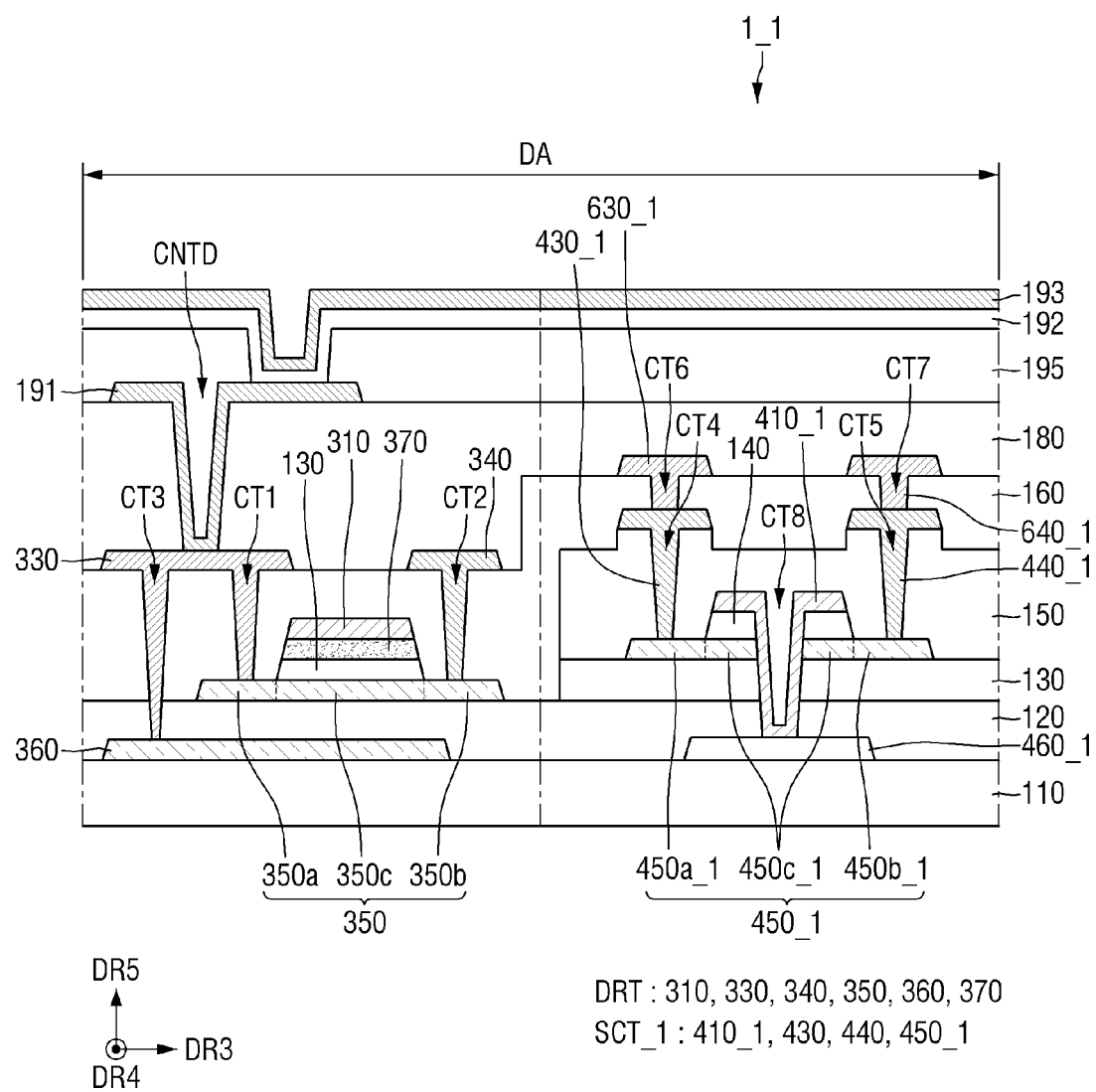
FIG. 28 is a schematic cross-sectional view taken along line I-I' of FIG. 5 and line II-II' of FIG. 27.

FIG. 27 is a plan view showing a first switching transistor of a display device according to an embodiment. FIG. 28 is a schematic cross-sectional view taken along line I-I' of FIG. 5 and line II-II' of FIG. 27.

A light-blocking layer may include a second light-blocking layer overlapping a second active layer 450 of a first switching transistor SCT.

According to the embodiment shown in FIGS. 27 and 28, a first switching transistor SCT_1 may further include a second light-blocking layer 460_1, and a second gate electrode 410_1 may be connected to the second light-blocking layer 460_1. The first switching transistor SCT_1 of FIGS. 27 and 28 may be different from the first switching transistor SCT of FIG. 7 in that the second gate electrode 410_1 may be connected to the second light-blocking layer 460_1. In the following description, descriptions will focus on the difference, and the redundant description will be omitted.

In the display device 1_1 of FIGS. 27 and 28, the light-blocking layer may include the second light-blocking layer 460_1. The first switching transistor SCT_1 may include a second gate electrode 410_1, a second active layer 450_1, a second source electrode 430_1, a second drain electrode 440_1, and a second light-blocking layer 460_1.

The second light-blocking layer 460_1 may be located or disposed on the first substrate 110. The second light-blocking layer 460_1 may prevent light from the outside being incident on the second active layer 450_1 through the first substrate 110. The lengths of the second light-blocking layer 460_1 in the third direction DR3 and the fourth direction DR4 may be larger than the lengths of the second active layer 450_1 in the third direction DR3 and the fourth direction DR4. It is, however, to be understood that the disclosure is not limited thereto.

The second gate electrode 410_1 may be in contact with the second light-blocking layer 460_1 through an eighth contact hole CT8. The eighth contact hole CT8 may be formed through the first gate insulating layer 130, the second gate insulating layer 140 and the buffer layer 120, to expose the second light-blocking layer 460_1. In such case, the second light-blocking layer 460_1 may be located or disposed under the second active layer 450_1 and the second gate electrode 410_1 may have the same voltage. In other words, the second gate electrode 410_1 may serve as an upper gate electrode, while the second light-blocking layer 460_1 may serve as a lower gate electrode. Accordingly, since the first switching transistor SCT_1 may be driven in a double gate manner, it may be possible to prevent leakage current from flowing through the channel region 450c_1 of the second active layer 450_1 of the first switching transistor SCT_1 when the first switching transistor SCT_1 may be turned off.

Figure 29:
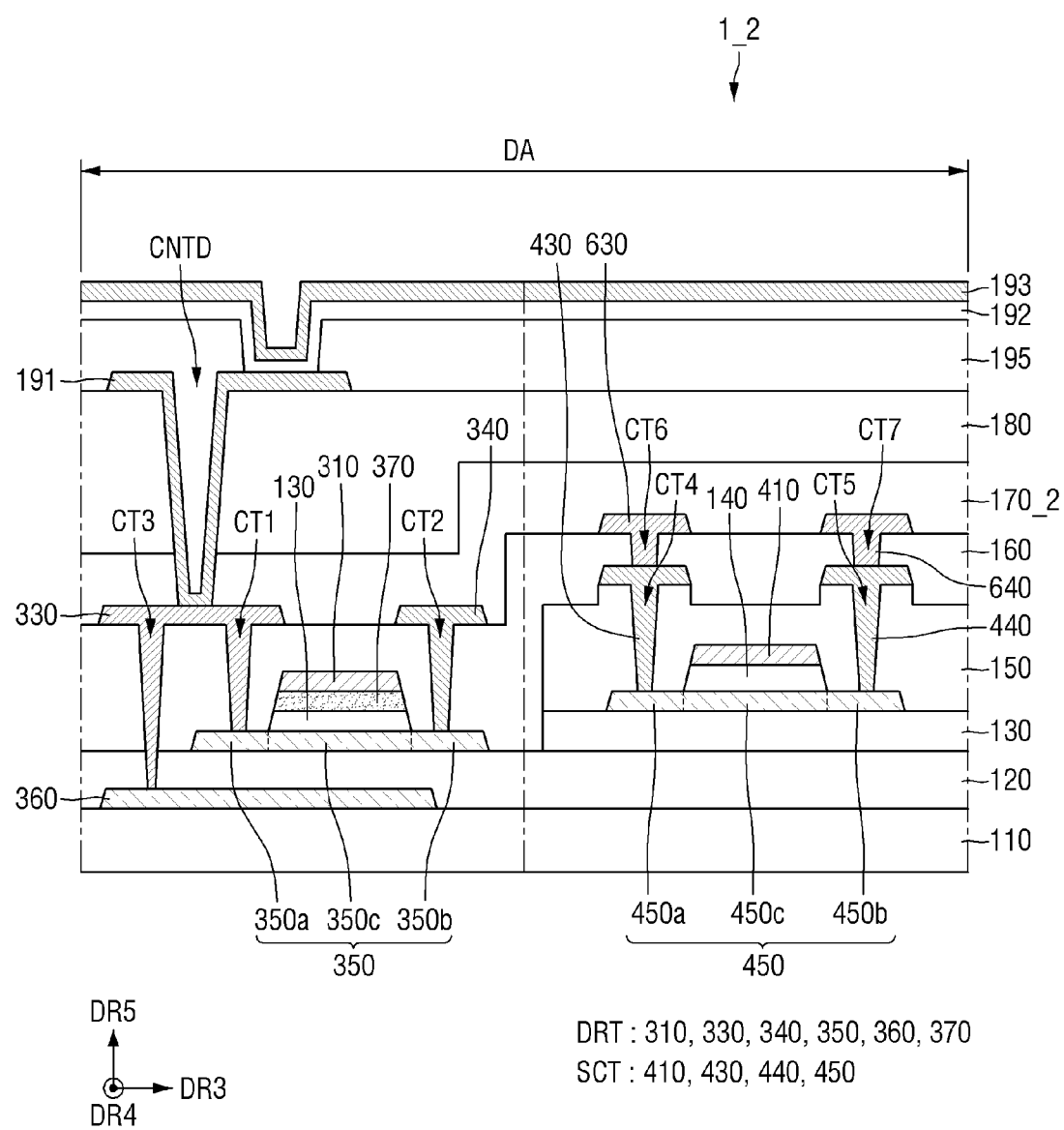
FIG. 29 is a schematic cross-sectional view showing a portion of a display device according to an embodiment.

FIG. 29 is a schematic cross-sectional view showing a display device according to an embodiment.

A display device 1_2 according to the embodiment shown in FIG. 29 may include a protective layer 170_2 located or disposed on a third conductive layer. This embodiment may be different from the embodiment of FIG. 7 in that the former includes a protective layer 170_2. Therefore, descriptions will focus on differences, and the redundant description will be omitted.

The display device 1_2 of FIG. 29 may include a protective layer 170_2 that may prevent elements on a third conductive layer, for example, conductive patterns 630 and 640 and the source/drain electrodes 330 and 340 from being damaged during a subsequent process. The protective layer 170_2 may be located or disposed on the passivation layer 160 to cover all of the elements on the third conductive layer. Accordingly, an electrode contact hole CNTD may be formed to penetrate the protective layer 170_2 in addition to the first planarization layer 180.

As described above, the second conductive pattern 640 among the conductive patterns of the third conductive layer may be eliminated.

Figure 30:
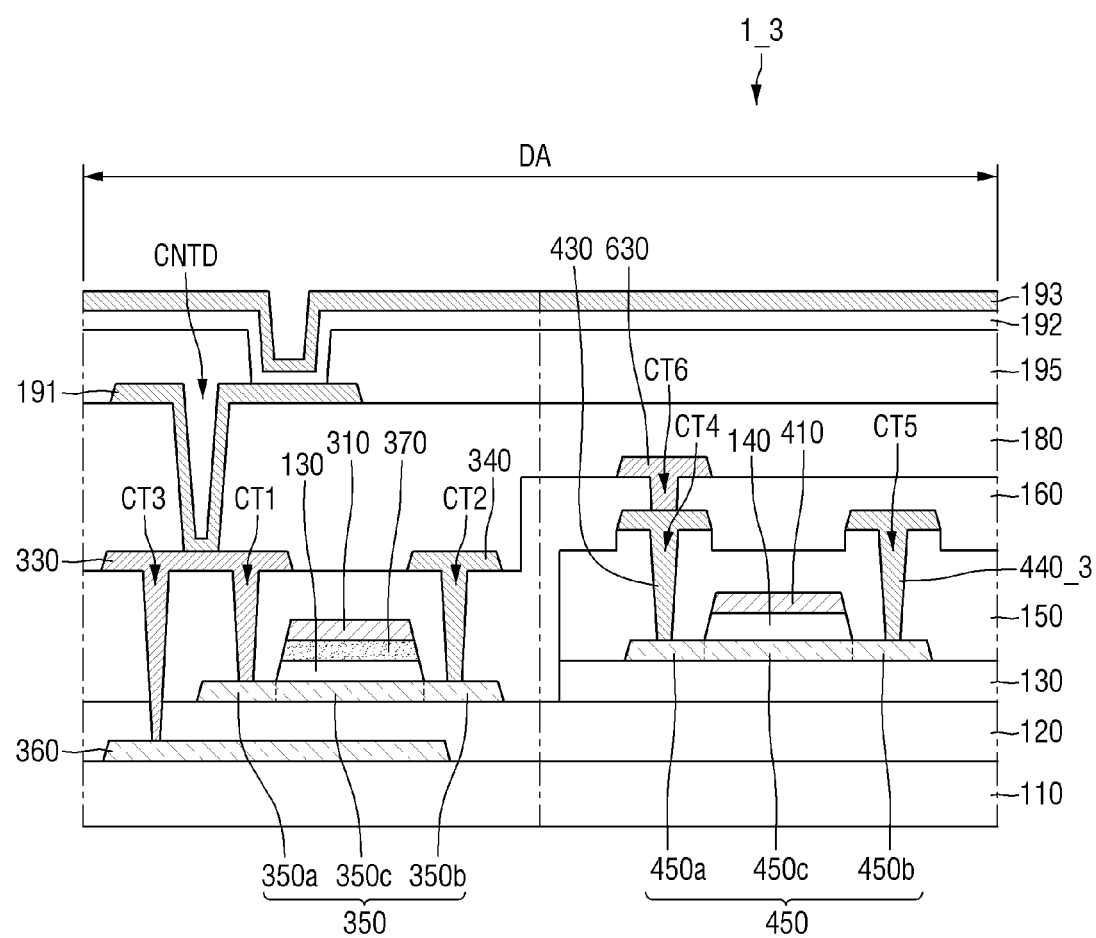
FIG. 30 is a schematic cross-sectional view of a portion of a display device according to an embodiment.

FIG. 30 is a schematic cross-sectional view of a portion of a display device according to an embodiment of the disclosure.

Referring to FIG. 30, in a display device 1_3 according to an embodiment, a second conductive pattern 640 of a third conductive layer may be eliminated. This embodiment may be different from the embodiment of FIG. 7 in that one conductive pattern may be eliminated. In the following description, descriptions will focus on the difference, and the redundant description will be omitted.

As described above, the second drain electrode 440 of the first switching transistor SCT may be connected to the data line DTL in some of the pixels PX. The second conductive pattern 640 that may be in contact with the second drain electrode 440 may be connected to the data line DTL in other pixels PX. When the first switching transistor SCT of one of the pixels PX may be connected to the data line DTL through the second drain electrode 440, the second conductive pattern 640 may be eliminated. In such case, the seventh contact hole CT7 may not be formed in the passivation layer 160. It is to be understood that the display device 1_3 of FIG. 30 may not necessarily include the structure in which the second conductive pattern 640 may be eliminated. In some implementations, the structure of the display device 1 of FIG. 7 and the structure of the display device 1_3 of FIG. 30 may be combined. For example, the second conductive pattern 670 may be located or disposed to be connected to the data line DTL and in contact with the second drain electrode 440 of the first switching transistor SCT in some of the pixels PX, and in other pixels PX, the second conductive pattern 640 may be eliminated and the second drain electrode 440 of the first switching transistor SCT may be connected (or directly connected) to the data line DTL. In this manner, the display device 1 according to the embodiment may apply a data signal to each of the pixels PX through different data lines DTL, allowing for the high speed driving of the display device 1.

Figure 31:
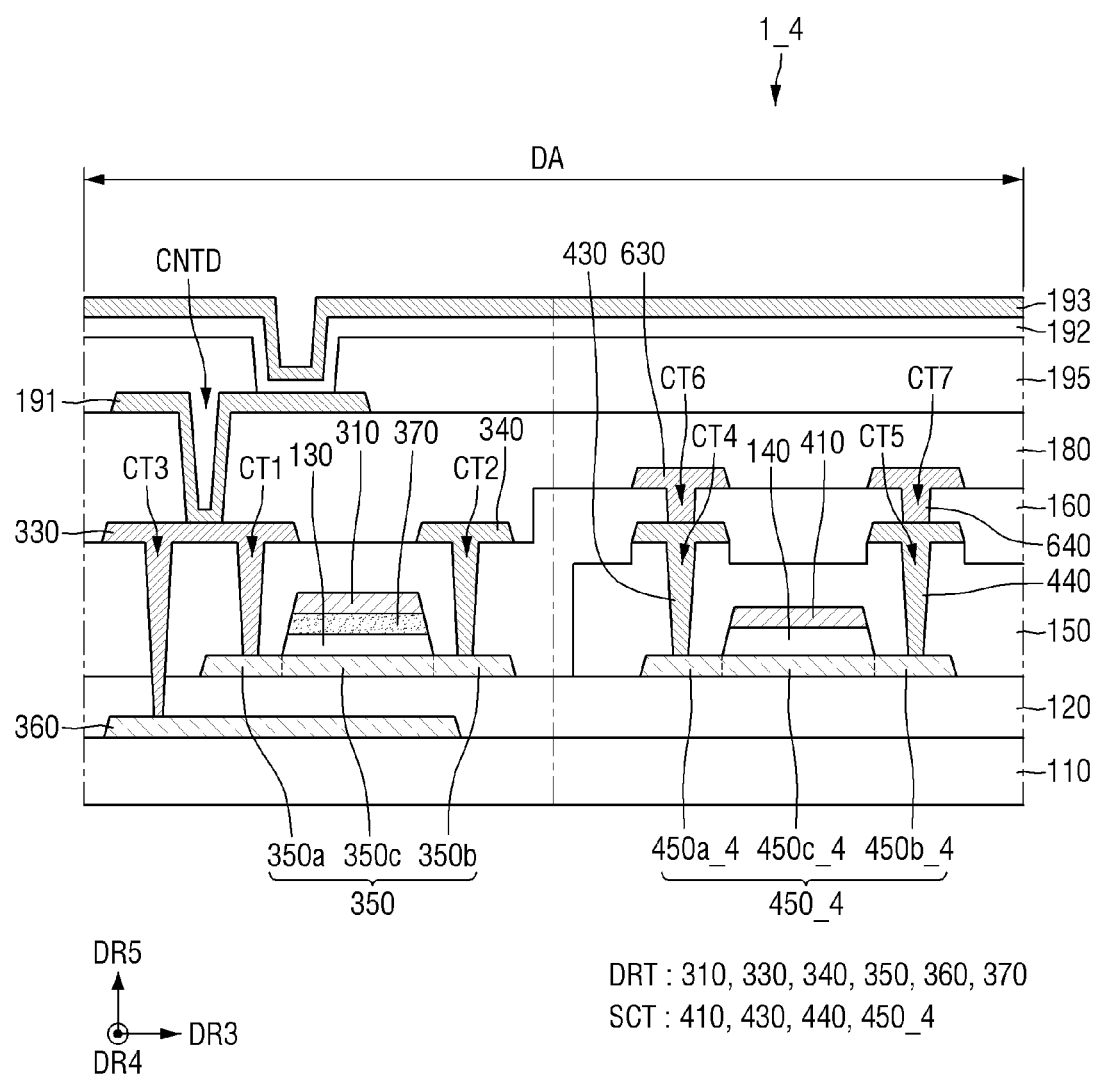
FIG. 31 is a schematic cross-sectional view of a portion of a display device according to an embodiment.

FIG. 31 is a schematic cross-sectional view of a display device according to an embodiment. FIGS. 32 and 33 are schematic cross-sectional views showing processing steps of a method of fabricating the display device shown in FIG. 31.

In a display device 1_4 according to an embodiment shown in FIG. 31, a second active layer 450_4 may be located or disposed (or directly disposed) on a buffer layer 120. In other words, the first gate layer 130 located or disposed under the first interlayer insulating layer 150 may be eliminated. This embodiment may be different from the embodiment of FIG. 7 in that the second active layer 450_4 may not be located or disposed on the first gate insulating layer 130. In the following description, descriptions will focus on the difference, and the redundant description will be omitted.

In the display device 1_4 of FIG. 31, the first gate insulating layer 130 may be located or disposed only between the first active layer 350 and the first oxide layer 370 and may not be located or disposed below the first interlayer insulating layer 150. Accordingly, the second active layer 450_4 may be located or disposed on the buffer layer 120, and the height from the buffer layer 120 to the upper surface of the first interlayer insulating layer 150 may be reduced.

The structure of the display device 1_4 may be implemented by adding a process of patterning the first insulating layer 130' during the fabricating process.

Referring to FIGS. 32 and 33, a portion of a first insulating layer 130'_4 located or disposed on a first active layer 350' may be patterned such that the buffer layer 120 may be partially exposed. The first insulating layer 130'_4 may not be located or disposed where a first switching transistor SCT may be located or disposed. An oxide semiconductor layer OXL_4 may be located or disposed on the first insulating layer 130'_4 and the buffer layer 120. Although not shown in the drawings, the portion of the oxide semiconductor layer OXL_4 located or disposed on the first insulating layer 130'_4 may form a first oxide layer 370 in a subsequent process, and the portion thereof located or disposed on the buffer layer 120 may form a second active layer 450_4 in a subsequent process.

Figure 34:
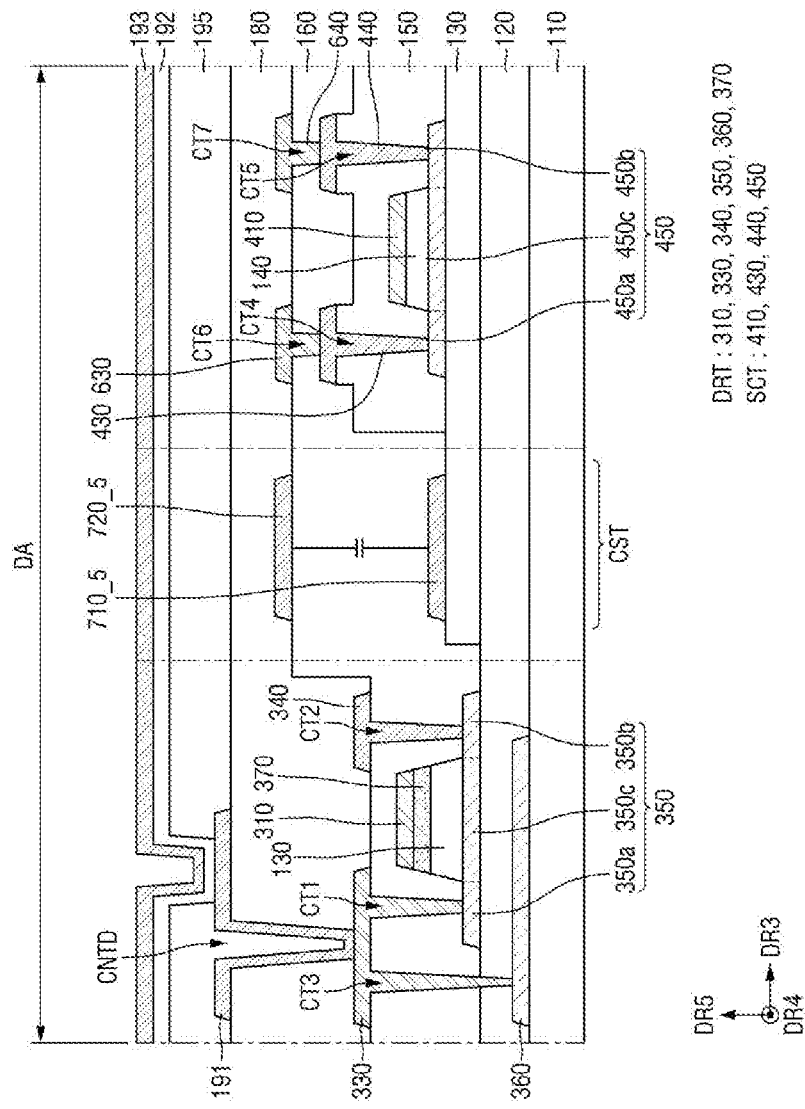
FIG. 34 is a schematic cross-sectional view showing a display device according to an embodiment.

FIG. 34 is a schematic cross-sectional view showing a portion of a display device according to an embodiment of the disclosure.

In a display device 1_5 according to the embodiment shown in FIG. 34, a third conductive pattern 710_5 may be located or disposed on a first gate insulating layer 130, the spacing between one electrode and the other electrode of a storage capacitor CST may be increased. This embodiment may be different from the embodiment of FIG. 10 in that the spacing between the third conductive pattern 710_5 and a fourth conductive pattern 720_5 may be increased. The third conductive pattern 710_5 may be located or disposed not only on the first interlayer insulating layer 150 but also on the first gate insulating layer 130 or the buffer layer 120. Accordingly, the spacing between one electrode and the other electrode of the storage capacitor CST may be increased, and accordingly charge capacity may be increased. In the following description, the redundant description will be omitted.

Incidentally, according to an embodiment, some of the second switching transistors located or disposed in the non-display area NDA may include pads PAD, unlike the first switching transistors SCT, or the active layer in some of them may include polycrystalline silicon.

Figure 35:
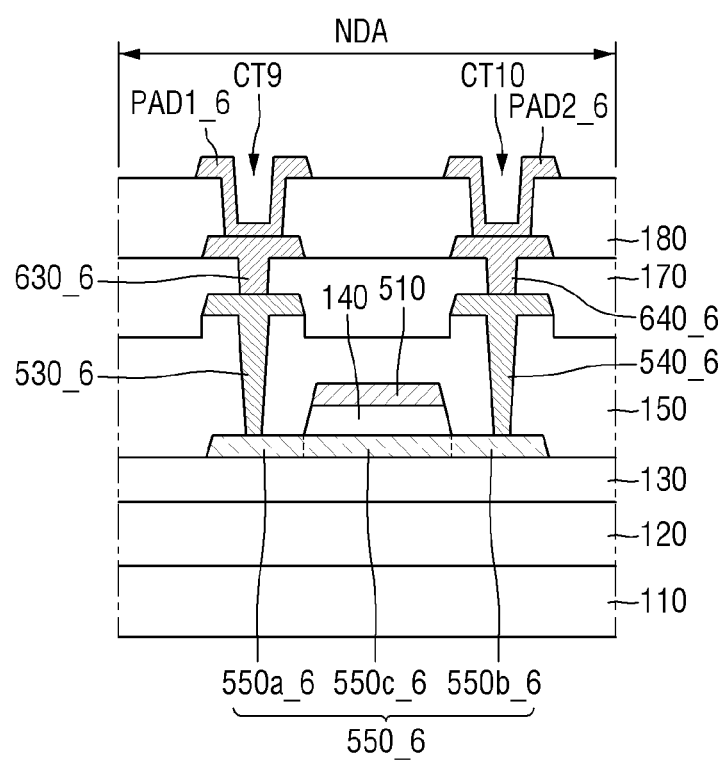
FIGS. 35 and 36 are schematic cross-sectional views showing second switching transistors according to embodiments.
Figure 36:
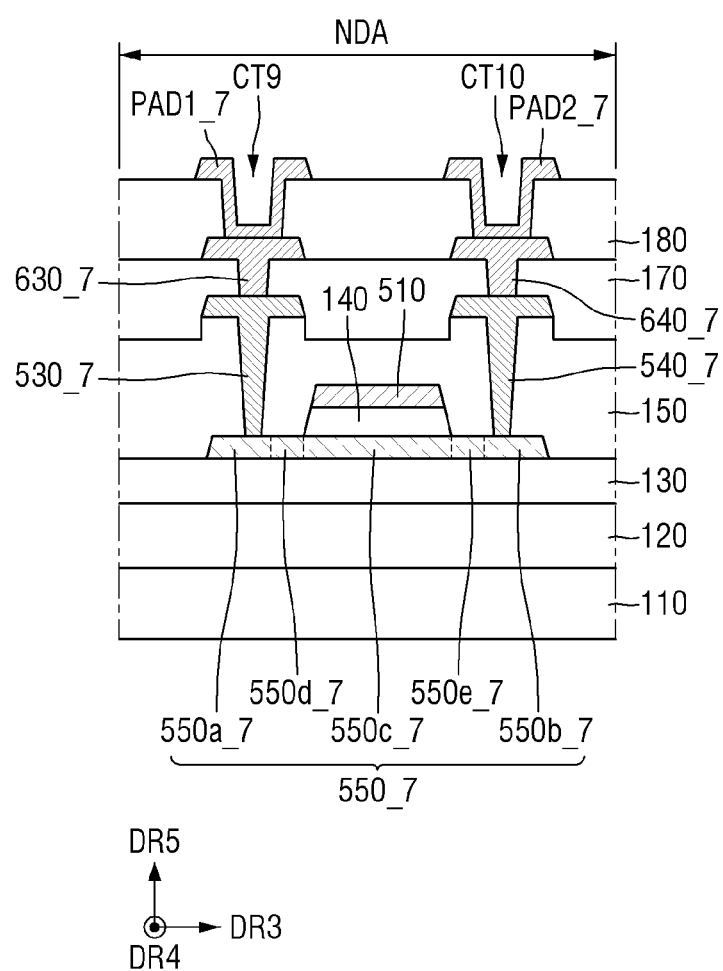

FIGS. 35 and 36 are schematic cross-sectional views showing second switching transistors according to an embodiment.

Referring initially to FIG. 35, second switching transistors located or disposed in the non-display area NDA according to an embodiment, for example, transistors included in a scan driver SDR and a data voltage dividing circuit DMUX each may have the same or similar structure as the first switching transistor SCT, and pads PAD1_6 and PAD2_6 may be in contact with the conductive patterns 630 and 640, respectively.

The second switching transistor may include a third active layer 550_6, a third gate electrode 510_6, a third source electrode 530_6, and a fourth drain electrode 540_6. The third active layer 550_6 may include a first conductive region 550a_6, a second conductive region 550b_6, and a channel region 550c_6. A detailed description thereon may be substantially identical to that given above with reference to FIG. 7. Therefore, the redundant description will be omitted.

The first planarization layer 180 or the bank layer 195 may not be located or disposed on the second switching transistor, and the conductive patterns 630_6 and 640_6 of the third conductive layer may be exposed to the external environment. During the process of fabricating the display device 1, the conductive patterns 630_6 and 640_6 may be partially etched in the etching process, and accordingly transistors included in the scan driver SDR and the data voltage dividing circuit DMUX may be damaged. To prevent damage, pads PAD1_6 and PAD2_6 in contact with the conductive patterns 630 and 640 of the third conductive layer may be located or disposed.

The pads may include a first pad PAD1_6 and a second pad PAD2_6, and the first pad PAD1_6 may be in contact with a first conductive pattern through a ninth contact hole CT9 formed in the first planarization layer 180. The second pad PAD2_6 may be in contact with the second conductive pattern 640_6 through a tenth contact hole CT10 formed in the first planarization layer 180. The first pad PAD1_6 and the second pad PAD2_6 may include a material capable of preventing the material of the conductive patterns 630_6 and 640_6 from being damaged. In an embodiment, the first pad PAD1_6 and the second pad PAD2_6 may include indium-tin oxide (ITO), indium-gallium-tin oxide (ITGO), indium-gallium-zinc oxide (IGZO) or indium-gallium-zinc-tin oxide (IGZTO). It is, however, to be understood that the disclosure is not limited thereto.

As an example, although the first pad PAD1_6 and the second pad PAD2_6 may be located or disposed on the first planarization layer 180 to protect the conductive patterns 630_6 and 640_6 located or disposed on the passivation layer 160 in the drawings, the disclosure is not limited thereto. When the first planarization layer 180 and the conductive patterns 630_6 and 640_6 may not be located or disposed in the non-display area NDA, the first pad PAD1_6 and the second pad PAD2_6 may be located or disposed on the passivation layer 160, which may be in contact with and protect the third source electrode 530_6 and the third drain electrode 540_6, respectively.

Referring to FIG. 36, in a second switching transistor according to the embodiment, a third active layer 550_7 may include polysilicon. In the following description, descriptions will focus on the difference, and the redundant description will be omitted.

In the second switching transistor of FIG. 36, the third active layer 550_7 may include polycrystalline silicon, and may include a first heavily-doped region 550a_7, a second heavily-doped region 550b_7, a channel region 550c_7, and a first lightly-doped region 550d_7, and a second lightly-doped region 550e_7. The channel region 550c_7 may be made of polycrystalline silicon that may not be doped with impurities. The first heavily-doped region 550a_7 and the second heavily-doped region 550b_7 may be made of polycrystalline silicon doped with high-concentration impurities. The first lightly-doped region 550d_7 and the second lightly-doped region 550e_7 may be made of polycrystalline silicon doped with low-concentration impurities. The third source electrode 530_7 and the third drain electrode 540_7 may be in contact with the first heavily-doped region 550a_7 and the second heavily-doped region 550b_7, respectively.

The first interlayer insulating layer 150 may be located or disposed on the third gate electrode 510. In the first interlayer insulating layer 150, a contact hole for exposing a portion of the upper surface of the third active layer 550_7 and a contact hole for exposing another portion of the upper surface of the third active layer 550_7 may be formed. One of the contact holes may expose the first heavily-doped region 550a_7 of the third active layer 550_7, while the other of the contact holes may expose the second heavily-doped region 550b_7 of the third active layer 550_7.

The third conductive layer may include a third source electrode 530_7 and a third drain electrode 540_7. The third source electrode 530_7 may be in contact with the first heavily-doped region 550a_7 formed at a side of the third active layer 550_7. The third drain electrode 540_7 may be in contact with the second heavily-doped region 550b_7 formed at another side of the third active layer 550_7. Conductive patterns 630_7 and 640_7 maybe located or disposed on the planarization layer 180.

When the third active layer 550_7 of the second switching transistor may include polycrystalline silicon, the third active layer 550_7 may have high mobility, and thus device characteristics of the second switching transistor may be improved. For example, even if the third active layer 550_7 has a small width of the channel region 550c_7, excellent mobility may be achieved, and thus the area of the non-display area NDA of the display device 1 may be reduced.

Each of the pull-up transistor and the pull-down transistor of the scan driver SDR and the transistors of the node controller may be implemented substantially identical to the pull-up transistor as shown in FIG. 36. For example, each of the first and second distribution transistors of the data voltage dividing circuit DMUX may be implemented substantially identical to the second switching transistor shown in FIG. 36. The detailed description thereon will be omitted.

In concluding the detailed description, those skilled in the art will appreciate that many variations and modifications may be made to the embodiments without substantially departing from the spirit and scope of the disclosure. Therefore, the disclosed embodiments are used in a generic and descriptive sense only and not for purposes of limitation.

What is claimed is:

1. A display device comprising:
a substrate;
a buffer layer disposed on the substrate;
a first semiconductor layer, which includes an oxide semiconductor, disposed on the buffer layer and comprising a first active layer;
a first gate insulating layer disposed on the first semiconductor layer and the buffer layer;
a second semiconductor layer, which includes an oxide semiconductor, disposed on the first gate insulating layer and comprising:
a second active layer; and
a first oxide layer disposed on the first active layer;
a second gate insulating layer disposed on the second semiconductor layer;
a first conductive layer disposed on the second gate insulating layer and comprising a gate electrode;
an interlayer insulating layer disposed on the first conductive layer and not overlapping with the first semiconductor layer;
a second conductive layer disposed on the interlayer insulating layer and the second semiconductor layer and comprising:
a gate electrode;
a source electrode; and
a drain electrode;
a passivation layer disposed on the second conductive layer; and
a third conductive layer disposed on the passivation layer and comprising:
a source electrode;
a drain electrode; and
a conductive pattern included in the third conductive layer,
wherein the second active layer does not overlap the first active layer.

2. The display device of claim 1, further comprising:
a protective layer disposed on the third conductive layer.

3. The display device of claim 1, wherein the oxide semiconductor of the first semiconductor layer and the second semiconductor layer comprises at least one of indium (In), gallium (Ga), zinc (Zn), tin (Sn) and hafnium (Hf).

4. The display device of claim 3, wherein the oxide semiconductor of the first semiconductor layer and the second semiconductor layer comprises at least one of indium-tin oxide (ITO), indium-gallium-tin oxide (ITGO), indium-gallium-zinc oxide (IGZO), and indium-gallium-zinc-tin oxide (IGZTO).

5. The display device of claim 1, wherein
the first gate insulating layer is disposed between the second active layer and the buffer layer, and
the second active layer is disposed on the first gate insulating layer.

6. The display device of claim 5, wherein
the second conductive layer comprises a first gate electrode disposed on the first oxide layer and overlapping the first active layer in a thickness direction, and
the first conductive layer comprises a second gate electrode disposed on the second gate insulating layer and overlapping the second active layer in the thickness direction.

7. The display device of claim 6, wherein
the second conductive layer comprises a first source electrode and a first drain electrode,
the first source electrode is in contact with a side of the first active layer through a first contact hole penetrating the interlayer insulating layer, and
the first drain electrode is in contact with another side of the first active layer through a second contact hole penetrating the interlayer insulating layer.

8. The display device of claim 7, further comprising:
a light-blocking layer disposed between the substrate and the buffer layer,
wherein the light-blocking layer comprises:
a first light-blocking layer disposed below the first active layer; and
a second light-blocking layer disposed below the second active layer.

9. The display device of claim 8, wherein the first source electrode is in contact with the first light-blocking layer through a third contact hole penetrating the passivation layer and the buffer layer.

10. The display device of claim 6, wherein
the first conductive layer comprises a second source electrode and a second drain electrode,
the second source electrode is in contact with a side of the second active layer through a fourth contact hole penetrating the interlayer insulating layer, and
the second drain electrode is in contact with another side of the second active layer through a fifth contact hole penetrating the interlayer insulating layer.

11. The display device of claim 10, wherein the conductive pattern comprises:
a first conductive pattern in contact with the second source electrode through a sixth contact hole penetrating through the passivation layer, and
a second conductive pattern in contact with the second drain electrode through a seventh contact hole penetrating through the passivation layer.

12. A display device comprising:
pixels connected to scan lines and data lines, the data lines intersecting the scan lines, wherein
each of the pixels comprises:
a light-emitting element;
a driving transistor to control a driving current applied to the light-emitting element according to a data voltage applied from the data lines; and
a switching transistor to apply the data voltage of the data line to the driving transistor according to a scan signal applied to the scan lines,
the driving transistor comprises:
a first active layer including an oxide semiconductor; and
a first oxide layer disposed on the first active layer and including an oxide semiconductor,
the switching transistor comprises:
a second active layer including a same oxide semiconductor as the first oxide layer,
a first gate insulating layer disposed on the first active layer and a second gate insulating layer disposed on the second active layer are disposed on different layers,
the first oxide layer and the second active layer are directly disposes on the first gate insulating layer, and
the first gate insulating layer is directly disposed on the first active layer.

13. The display device of claim 12, wherein the oxide semiconductor of the first active layer comprises at least one of indium (In), gallium (Ga), zinc (Zn), tin (Sn) and hafnium (Hf).

14. The display device of claim 13, wherein the oxide semiconductor of each of the first oxide layer and the second active layer comprises at least one of indium (In), gallium (Ga), zinc (Zn), tin (Sn) and hafnium (Hf).

15. The display device of claim 12, wherein the second gate insulating layer is disposed above the first gate insulating layer.

16. The display device of claim 15, wherein
the first gate insulating layer is disposed below the second active layer, and
the second active layer is disposed on the first gate insulating layer.

17. The display device of claim 12, wherein
the driving transistor comprises a first gate electrode disposed on the first oxide layer and overlapping the first active layer in a thickness direction, and
the switching transistor comprises a second gate electrode disposed on the second gate insulating layer and overlapping the second active layer in the thickness direction.

18. The display device of claim 17, wherein the driving transistor comprises:
a first source electrode in contact with a side of the first active layer through a first contact hole penetrating through a passivation layer disposed on the first active layer; and
a first drain electrode in contact with another side of the first active layer through a second contact hole penetrating through the passivation layer.

19. The display device of claim 18, wherein the switching transistor comprises:
a second source electrode in contact with a side of the second active layer through a third contact hole penetrating through an interlayer insulating layer disposed on the second active layer; and
a second drain electrode in contact with another side of the second active layer through a fourth contact hole penetrating through the interlayer insulating layer.

20. The display device of claim 19, wherein
the passivation layer is disposed on the second source electrode and the second drain electrode,
the second source electrode is in contact with a first conductive pattern disposed on the passivation layer through a fifth contact hole penetrating through the passivation layer, and
the second drain electrode is in contact with a second conductive pattern disposed on the passivation layer through a sixth contact hole penetrating through the passivation layer.

21. A method of manufacturing a display device, comprising:
forming a first semiconductor layer including:
forming a first active layer on a substrate,
wherein the first semiconductor layer includes an oxide semiconductor;
forming a first gate insulating layer on the first semiconductor layer;
forming a second semiconductor layer including:
forming a second active layer; and
forming a first oxide layer on the first active layer,
wherein the second semiconductor layer includes an oxide semiconductor;
forming a second gate insulating layer on the second semiconductor layer;
forming a first conductive layer on the second gate insulating layer;
forming an insulating layer on the first conductive layer;
forming a second conductive layer on the insulating layer;
forming a passivation layer on the second conductive layer; and
forming a third conductive layer including a conductive pattern on the passivation layer.

* * * * *